(12) United States Patent
Gatto

(10) Patent No.: US 12,389,648 B2
(45) Date of Patent: Aug. 12, 2025

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Ayanori Gatto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 438 days.

(21) Appl. No.: 17/812,694

(22) Filed: Jul. 14, 2022

(65) Prior Publication Data

US 2023/0114260 A1 Apr. 13, 2023

(30) Foreign Application Priority Data

Oct. 13, 2021 (JP) .................... 2021-167974

(51) Int. Cl.
  *H01L 29/08* (2006.01)
  *H10D 30/66* (2025.01)
  (Continued)

(52) U.S. Cl.
  CPC ......... *H10D 62/157* (2025.01); *H10D 30/665* (2025.01); *H10D 62/153* (2025.01); *H10D 62/393* (2025.01)

(58) Field of Classification Search
  CPC ............... H01L 29/0878; H01L 29/086; H01L 29/1095; H01L 29/7811; H01L 29/36;
  (Continued)

(56) References Cited

U.S. PATENT DOCUMENTS

2018/0374948 A1 12/2018 Naito
2019/0088799 A1 3/2019 Mauder et al.

FOREIGN PATENT DOCUMENTS

DE  11 2017 000 689 T5  10/2018
DE  10 2017 121 878 A1  3/2019
JP  2013-021142 A  1/2013

OTHER PUBLICATIONS

An Office Action issued by the German Patent and Trademark Office on Apr. 14, 2025, which corresponds to German Patent Application No. 102022122701.4 and is related to U.S. Appl. No. 17/812,694; with English language translation.

*Primary Examiner* — Cuong B Nguyen
(74) *Attorney, Agent, or Firm* — Studebaker Brackett PLLC

(57) ABSTRACT

Provided is a semiconductor device capable of suppressing breakdown of the semiconductor device by a full depletion of a semiconductor layer. The semiconductor device includes: a first semiconductor layer of a first conductivity type provided on a second main surface side of a semiconductor base body; a second semiconductor layer of the first conductivity type having a first conductivity type impurity concentration lower than that of the first semiconductor layer and provided closer to a first main surface than the first semiconductor layer is; and a third semiconductor layer of a second conductivity type provided closer to the first main surface than the second semiconductor layer is. An impurity concentration distribution of the third semiconductor layer with respect to thickness direction of the semiconductor base body has a plurality of peaks. A thickness W of the third semiconductor layer satisfies a certain condition.

12 Claims, 16 Drawing Sheets

(51) Int. Cl.
*H10D 62/13* (2025.01)
*H10D 62/17* (2025.01)

(58) Field of Classification Search
CPC ............. H01L 29/66136; H01L 29/861; H01L 29/6603; H01L 29/6606; H01L 29/66204; H10D 62/157; H10D 30/665; H10D 62/153; H10D 62/393; H10D 8/00; H10D 8/045; H10D 62/128; H10D 62/60
See application file for complete search history.

LOW CURRENT DENSITY J { 14a: CARRIER CONCENTRATION IN ON-STATE
14b: HOLE CONCENTRATION IN RECOVERY STATE
14c: ELECTRON CONCENTRATION IN RECOVERY STATE

HIGH CURRENT DENSITY J { 14d: CARRIER CONCENTRATION IN ON-STATE
14e: HOLE CONCENTRATION IN RECOVERY STATE
14f: ELECTRON CONCENTRATION IN RECOVERY STATE

SHORT LIFETIME { 15a: CARRIER CONCENTRATION IN ON-STATE
15b: HOLE CONCENTRATION IN RECOVERY STATE
15c: ELECTRON CONCENTRATION IN RECOVERY STATE

LONG LIFETIME { 15d: CARRIER CONCENTRATION IN ON-STATE
15e: HOLE CONCENTRATION IN RECOVERY STATE
15f: ELECTRON CONCENTRATION IN RECOVERY STATE

| RATED VOLTAGE | $V_{cc}$ [v] |
|---|---|
| 600v | 450 |
| 1200v | 800 |
| 1700v | 1200 |
| 3300v | 2500 |
| 4500v | 3200~3600 |
| 6500v | 4500 |

FIG. 19

| RATED VOLTAGE | RATED CURRENT DENSITY [A/cm$^2$] | 2.5×RATED CURRENT DENSITY [A/cm$^2$] |
|---|---|---|
| 600v | 240~360 | 600~900 |
| 1200v | 210~310 | 525~775 |
| 1700v | 180~270 | 450~675 |
| 3300v | 65~120 | 162.5~300 |
| 4500v | 60~120 | 150~300 |
| 6500v | 55~120 | 137.5~300 |

FIG. 20

| RATED VOLTAGE | THICKNESS $W_{N-}$ OF THE N- TYPE SUBSTRATE 1 [$\mu$m] |
|---|---|
| 600v | 48~72 |
| 1200v | 80~120 |
| 1700v | 150~185 |
| 3300v | 350~400 |
| 4500v | 450~530 |
| 6500v | 550~700 |

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing the semiconductor device.

Description of the Background Art

Japanese Patent Application Laid-Open No. 2013-021142 discloses a semiconductor device that have a configuration for decreasing switching losses.

In semiconductor devices, there is a problem that a semiconductor layer is fully-depleted and the semiconductor device is broken down during recovery operations with high current and high voltage.

SUMMARY

The present disclosure has an object to provide a semiconductor device capable of suppressing full depletion of a semiconductor layer in recovery operation with high current and high voltage, and capable of suppressing breakdown of the semiconductor device by the full depletion of the semiconductor layer.

The semiconductor device of the present disclosure includes: a semiconductor base body having a first main surface and a second main surface; a first electrode; and a second electrode. The semiconductor base body includes: a first semiconductor layer of a first conductivity type provided on the second main surface side of the semiconductor base body; a second semiconductor layer of the first conductivity type having a first conductivity type impurity concentration lower than that of the first semiconductor layer and provided closer to the first main surface than the first semiconductor layer is; and a third semiconductor layer of a second conductivity type provided closer to the first main surface than the second semiconductor layer is. The first semiconductor layer is electrically connected to the second electrode in the second main surface. The third semiconductor layer is electrically connected to the first electrode in the first main surface. An impurity concentration distribution of the third semiconductor layer with respect to thickness direction of the semiconductor base body has a plurality of peaks. A thickness W of the third semiconductor layer, a thickness $W_{N-}$ of the second semiconductor layer, the elementary charge q, a relative permittivity $\varepsilon_s$ of the semiconductor material, the vacuum permittivity $\varepsilon_0$, a rated voltages $V_r$, a rated current density $J_r$, a carrier lifetime $\tau$ of a second conductivity type carrier in the second semiconductor layer, a dose amount $D_A$ of the third semiconductor layer, and $\alpha(\tau)=4.15/(\ln(2.58\tau+1))^{4.77}+225$ which represents a relation between an average carrier concentration of the second semiconductor layer in on-state of the semiconductor device and an electric charge concentration in a depletion layer around a border of the second semiconductor layer and the third semiconductor layer among the second semiconductor layer in recovery process of the semiconductor device, satisfies $W > (1.6\varepsilon_s\varepsilon_0 V_r)/qD_A - (2qW_{N-}D_A)/(2.5\alpha(\tau)J_r\tau)$.

According to the present disclosure, a semiconductor device capable of suppressing full depletion of a semiconductor layer in the recovery operation with high current and high voltage, and capable of suppressing breakdown of the semiconductor device by the full depletion of the semiconductor layer.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 19 is a diagram showing a representative value of rated current density and a representative value of high current density in on-state just before a switching for each of the rated voltages in the semiconductor devices according to the embodiment 1.

FIG. 20 is a diagram showing a representative value of the thickness of the N− type substrate 1 for each of the rated voltages in the semiconductor devices according to the embodiment 1.

DESCRIPTION OF THE PREFERRED EMBODIMENTS

In the following description N type and P type, which are the conductivity types of the semiconductor, are interchangeable.

COMPARATIVE EXAMPLE

Figure 21:
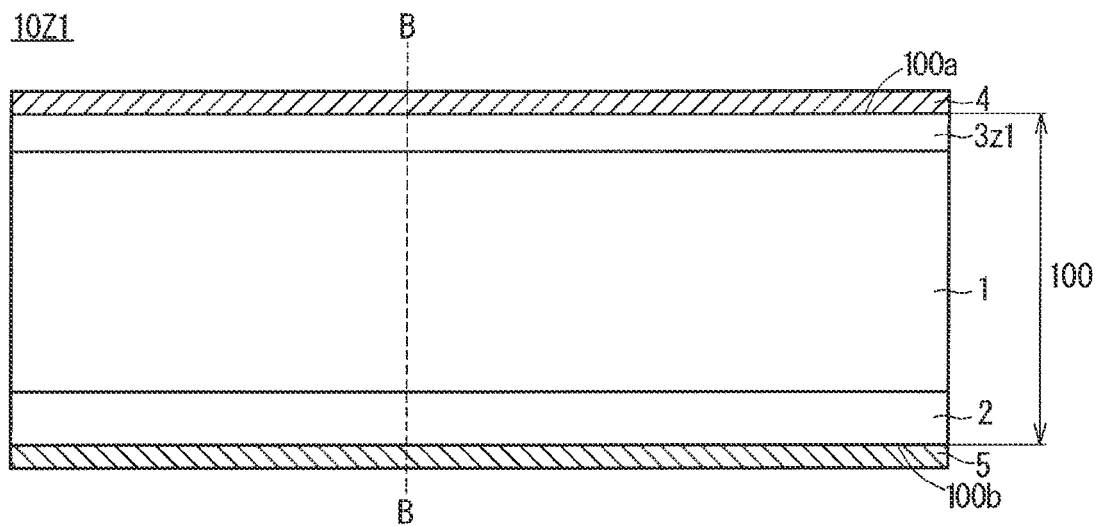
FIGS. 21 and 22 are diagrams showing the semiconductor devices according to comparative examples.
Figure 22:
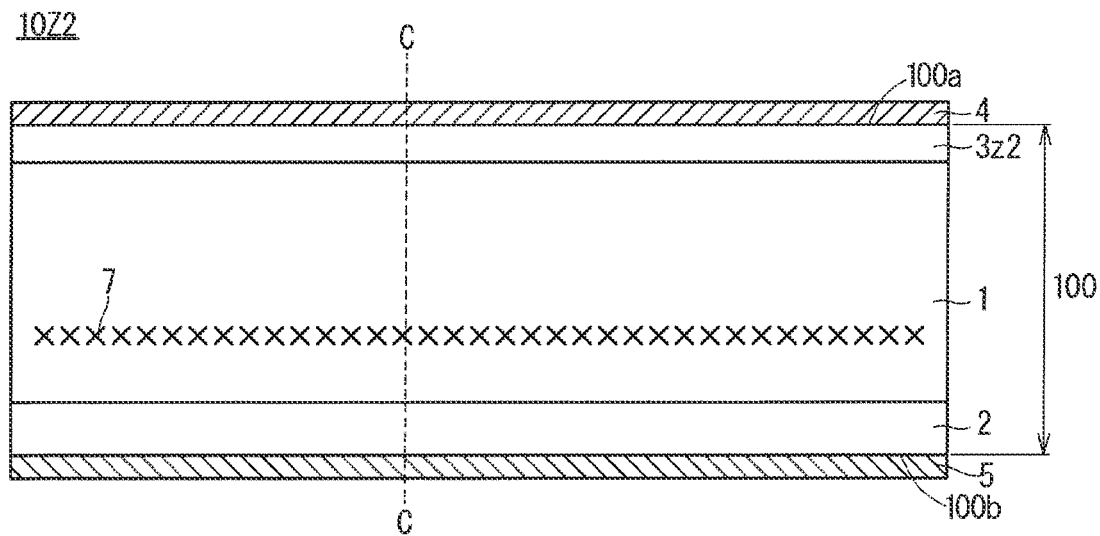

FIG. 21 shows a semiconductor device 10z1 according to a comparative example. FIG. 22 shows a semiconductor device 10z2 according to a comparative example.

The semiconductor device 10z1 includes a semiconductor base body 100, an anode electrode 4, and a cathode electrode 5.

The semiconductor base body 100 has a first main surface 100a and a second main surface 100b. The semiconductor base body 100 includes an N− type substrate 1, an N type diffusion layer 2, and a P type diffusion layer 3z1.

The N type diffusion layer 2 is located on the second main surface 100b side of the semiconductor base body 100. The N− type substrate 1 is closer to the first main surface 100a than the N type diffusion layer 2 is. The P type diffusion layer 3 is closer to the first main surface 100a than the N− type substrate 1 is. N type impurity concentration of the N− type substrate 1 is lower than N type impurity concentration of the N type diffusion layer 2.

Compared to the semiconductor device 10z1, the semiconductor device 10z2 includes a P type diffusion layer 3z2 instead of the P type diffusion layer 3z1. In addition, lifetime killers 7 are provided in the N− type substrate 1 in the semiconductor device 10z2.

The semiconductor device 10z1 and the semiconductor device 10z2 are each a diode. In the following description, the semiconductor device 10z1 may be referred to as a comparative example 1, and the semiconductor device 10z2 may be referred to as a comparative example 2.

Figure 3:
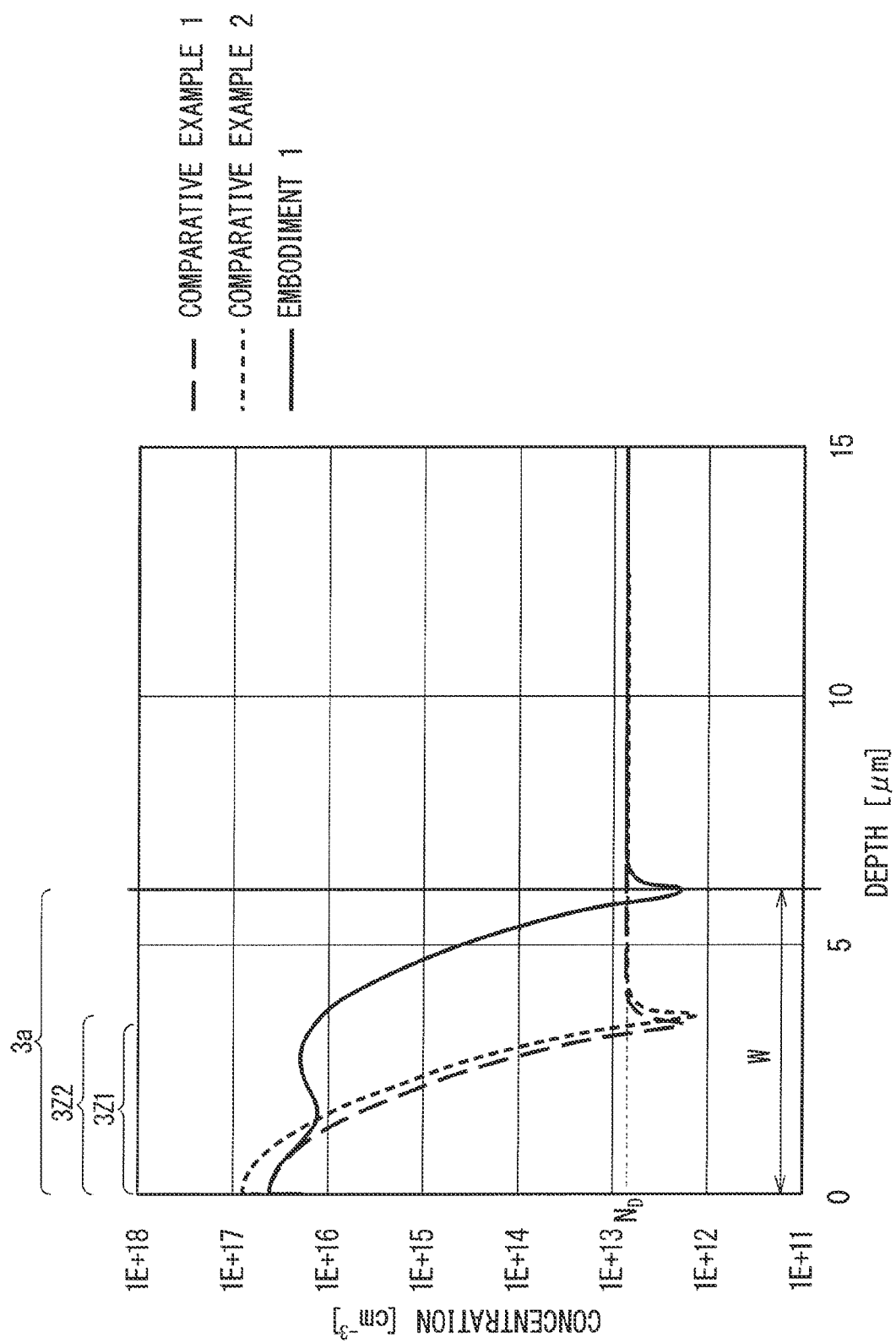
FIG. 3 is a diagram showing the impurity concentration distribution according to the embodiment 1 and comparative example.

FIG. 3 shows the impurity concentration of the P type diffusion layer 3z1 and the N− type substrate 1 along the B-B line shown in FIG. 21 (comparative example 1 in FIG. 3).

FIG. 3 shows the impurity concentration of the P type diffusion layer 3z2 and the N− type substrate 1 along the C-C line shown in FIG. 22 (comparative example 2 in FIG. 3).

In FIG. 3, horizontal axis represents positions with respect to thickness direction. In FIG. 3, the position with depth 0 μm corresponds to the first main surface 100a.

In the semiconductor device 10z1, to reduce switching loss, the dose amount to the P type diffusion layer 3z1 is lowered and the impurity concentration of the P type diffusion layer 3z1 is lowered. Nevertheless, in a case where the impurity concentration of the P type diffusion layer 3z1 is lower than or equal to 2.5 E 16 cm$^{-3}$, during a recovery operation after a switching from an on-state in which a high voltage is applied and a high current flowed in forward direction, a depletion layer around the border of the P type diffusion layer 3z1 and the N− type substrate 1 reach to the anode electrode 4, and the device is broken down by the recovery current in the P type diffusion layer 3z1. Thus, there is a limit to the reduction in switching loss by lowering the impurity concentration of the P type diffusion layer 3z1.

In the semiconductor device 10z2, lifetime killers 7 are provided in the N− type substrate 1 to reduce the switching loss. The lifetime killers 7 are formed by electron beam irradiation from the second main surface 100b side. Since the electron beam passes the N type diffusion layer 2 which is a surface layer of the semiconductor base body 100 in the second main surface 100b side, the electron beam irradiation increases the unevenness of the properties among the semiconductor devices 10z2.

To reduce the switching loss, configurations in which the impurity concentration of the P type diffusion layer 3z1 or the P type diffusion layer 3z2 varies depending in-plane position, and P+ regions with relatively high impurity concentration and P regions with relatively low impurity concentration are disposed alternatively in one of in-plane directions may be adopted. In this case, when the reverse high voltage is applied during the recovery operation after the switching from on-state with high forward current, an avalanche current is generated by the concentration of the electric field on the border portion between the P+ regions and the P regions, and the border portion between the P+ regions and the P regions is broken down by the heat.

A. Embodiment 1

<A-1. Configuration and Operation>

Figure 1:
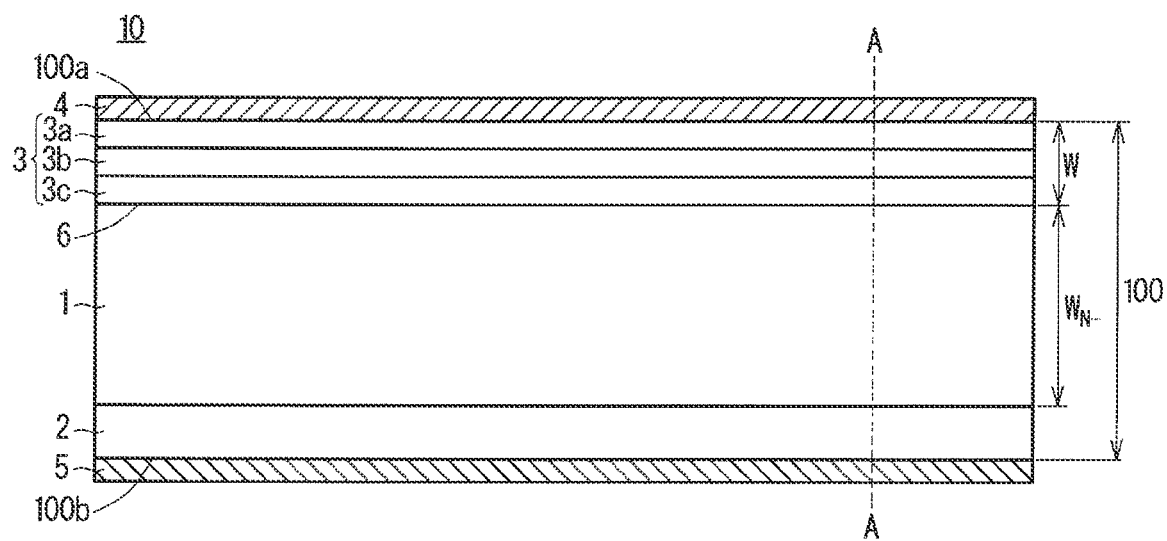
FIG. 1 is a diagram showing a semiconductor device according to the embodiment 1.

FIG. 1 shows a semiconductor device 10 according to the embodiment 1.

The semiconductor device 10 includes a semiconductor base body 100, an anode electrode 4, and a cathode electrode 5.

The semiconductor base body 100 has a first main surface 100a and a second main surface 100b. The semiconductor base body 100 includes an N− type substrate 1 (an example of a second semiconductor layer), an N type diffusion layer 2 (an example of a first semiconductor layer), and a P type diffusion layer 3 (an example of a third semiconductor layer). The semiconductor base body 100 includes the P type diffusion layer 3, which is composed of semiconductor layer with one conductive type, in the surface layer on the first main surface 100a.

The junction part between the N− type substrate 1 and the P type diffusion layer 3 is referred to as the PN junction part 6.

The P type diffusion layer 3 is electrically connected to the anode electrode 4 in the first main surface 100a. The N type diffusion layer 2 is electrically connected to the cathode electrode 5 in the second main surface 100b.

The P type diffusion layer 3 includes a P type diffusion layer 3a, a P type diffusion layer 3b, and a P type diffusion layer 3c.

The N type diffusion layer 2 is located in the surface layer on the second main surface 100b side of the semiconductor base body 100.

The N− type substrate 1 is closer to the first main surface 100a than the N type diffusion layer 2 is. The P type diffusion layer 3 is closer to the first main surface 100a than the N− type substrate 1 is. The N type impurity concentration of the N− type substrate 1 is lower than the N type impurity concentration of the N type diffusion layer 2.

The N− type substrate 1 is a semiconductor layer containing, for example, arsenic or phosphorus as N type impurities.

Diode structure is formed by the N type diffusion layer 2, the P type diffusion layer 3, and the N− type substrate 1.

The semiconductor device 10 is a diode. The semiconductor device 10 may be a power semiconductor device which includes a diode as a part thereof, such as a reverse-conducting insulated gate bipolar transistor (RC-IGBT).

The N type impurity concentration of the N− type substrate 1 is 1.0E12 cm$^{-3}$ to 1.0E14 cm$^{-3}$.

The N type diffusion layer 2 is a semiconductor layer containing, for example, arsenic or phosphorus as N type impurities. The N type impurity concentration of the N type diffusion layer 2 is 1.0E14 cm$^{-3}$ to 1.0E21 cm$^{-3}$.

The P type diffusion layer 3 is a semiconductor layer containing, for example, boron or aluminum as P type impurities. The P type impurity concentration distribution of the P type diffusion layer 3 with respect to the thickness direction has plurality of peaks. In the following, a case is described where the P type impurity concentration distribution of the P type diffusion layer 3 with respect to the thickness direction has two peaks, as an example. Nevertheless, the P type impurity concentration distribution of the P type diffusion layer 3 with respect to the thickness direction may have more than two peaks.

The P type diffusion layer 3a and the P type diffusion layer 3c are each the region around each of the two peaks of the P type impurity concentration distribution of the P type diffusion layer 3 with respect to the thickness direction. The P type diffusion layer 3b is a region between the two peaks, namely a region between the P type diffusion layer 3a and the P type diffusion layer 3c.

FIG. 3 shows an example of the impurity concentration distribution along the A-A line in FIG. 1 (shown as the embodiment 1 in FIG. 3). In FIG. 3, the position with depth 0 μm corresponds to the first main surface 100a. In FIG. 3, the difference of the N type impurity concentration and the P type impurity concentration is plotted. In the P type diffusion layer 3b, the impurity concentration of the P type impurity is higher than the impurity concentration of the N type impurity. In the N− type substrate 1, the impurity concentration of the N type impurity is higher than the impurity concentration of the P type impurity.

The maximum value of the impurity concentration distribution of the P type diffusion layer 3 is less than or equal to $1.0E17\ cm^{-3}$.

The P type impurity concentration of the P type diffusion layer 3b is higher than the N type impurity concentration $N_D$ of the N− type substrate 1. As a result, latch-up is suppressed. The same applies for the case where P type impurity concentration distribution of the P type diffusion layer 3 with respect to the thickness direction has more than two peaks. Namely, in a region of the P type diffusion layer 3 which locates between the peak closest to the first main surface 100a and the peak closest to the second main surface 100b among the peaks of the impurity concentration distribution of the P type diffusion layer 3 with respect to the thickness direction, the minimum value of the P type impurity concentration is higher than the N type impurity concentration of the N− type substrate 1.

The P type impurity concentration of the P type diffusion layer 3b is higher than $1.0E13\ cm^{-3}$.

Of the two peaks of the P type impurity concentration distribution of the P type diffusion layer 3 with respect to the thickness direction, impurity concentrations are highest at the peak closer to the first main surface 100a. In the case where P type impurity concentration distribution of the P type diffusion layer 3 with respect to the thickness direction has more than two peaks, impurity concentrations are highest at the peak closest to the first main surface 100a among the more than two peaks, for example.

The P type impurity concentration distribution of the P type diffusion layer 3 with respect to the thickness direction may be such that it has two peaks and the impurity concentrations are highest at the peak closer to the second main surface 100b of the two peaks. Similarly, in the case where P type impurity concentration distribution of the P type diffusion layer 3 with respect to the thickness direction has more than two peaks, the impurity concentrations may be highest at the peak closest to the second main surface 100b among the more than two peaks, for example.

<A-2. Comparison with the Comparative Example>
FIGS. 4 to 6 show the result of comparison between the semiconductor devices according to the present embodiment and the semiconductor devices according to the comparative example.

Figure 4:
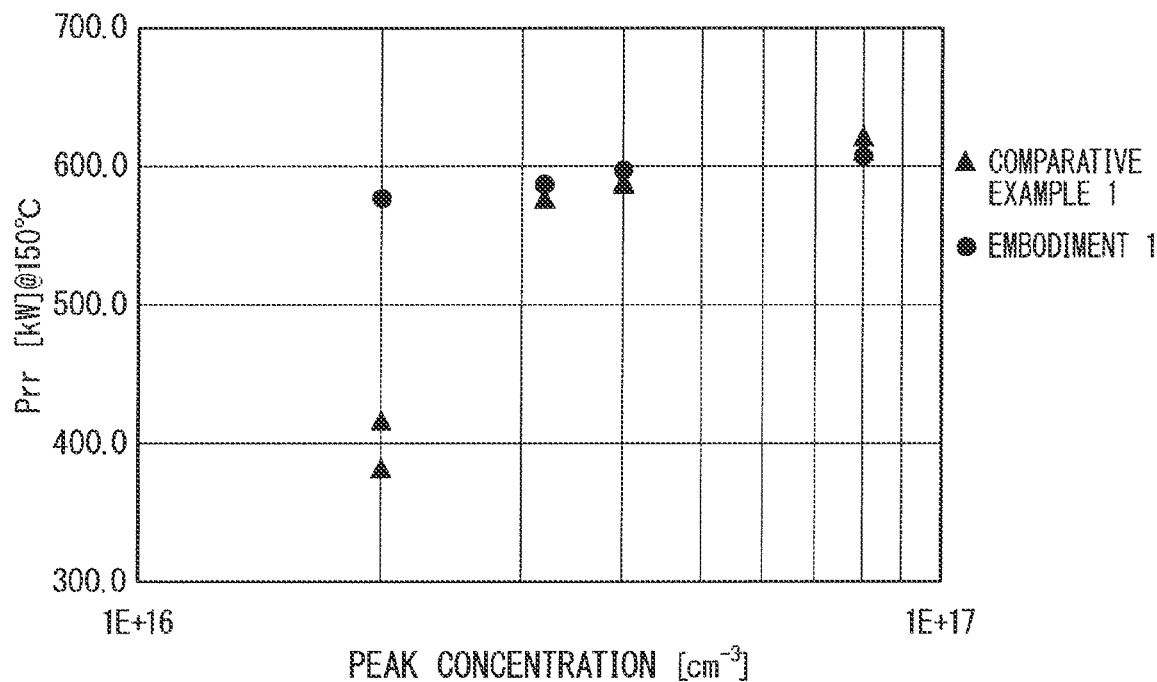
FIG. 4 is a diagram showing the relation between the maximum value of the impurity concentration and the maximum recovery blocking power in the semiconductor devices according to the embodiment 1 and according to the comparative example.

FIG. 4 shows the relation between the maximum value of the impurity concentration of the P type diffusion layer 3 and the maximum recovery blocking power Prr in the semiconductor devices 10z1 of the comparative example and in the semiconductor devices 10 of the embodiment 1. FIG. 4 shows the data at 150° C. The maximum recovery blocking power is a maximum value of the electric power of the reverse current which is allowed to the semiconductor devices 10z1 or the semiconductor devices 10. As shown in FIG. 4, in the configuration of the comparative example 1, Prr substantially decrease in the case where the maximum value of the impurity concentration of the P type diffusion layer 3z1 is lower than or equal to $2.5E16\ cm^{-3}$. On the other hand, in the configuration of the current embodiment, Prr do not show substantial decrease even in the case where the maximum value of the impurity concentration of the P type diffusion layer 3 is lower than or equal to $2.5E16\ cm^{-3}$. As described above, with the configuration in which the P type impurity concentration distribution of the P type diffusion layer 3 with respect to the thickness direction has two peaks, impurity implantation amount into the P type diffusion layer 3 can be lowered with the decrease of the maximum recovery blocking power Prr suppressed. By lowering the impurity implantation amount into the P type diffusion layer 3, flow of holes from P type diffusion layer 3 into the N− type substrate 1 is suppressed, and the switching loss is suppressed.

Figure 5:
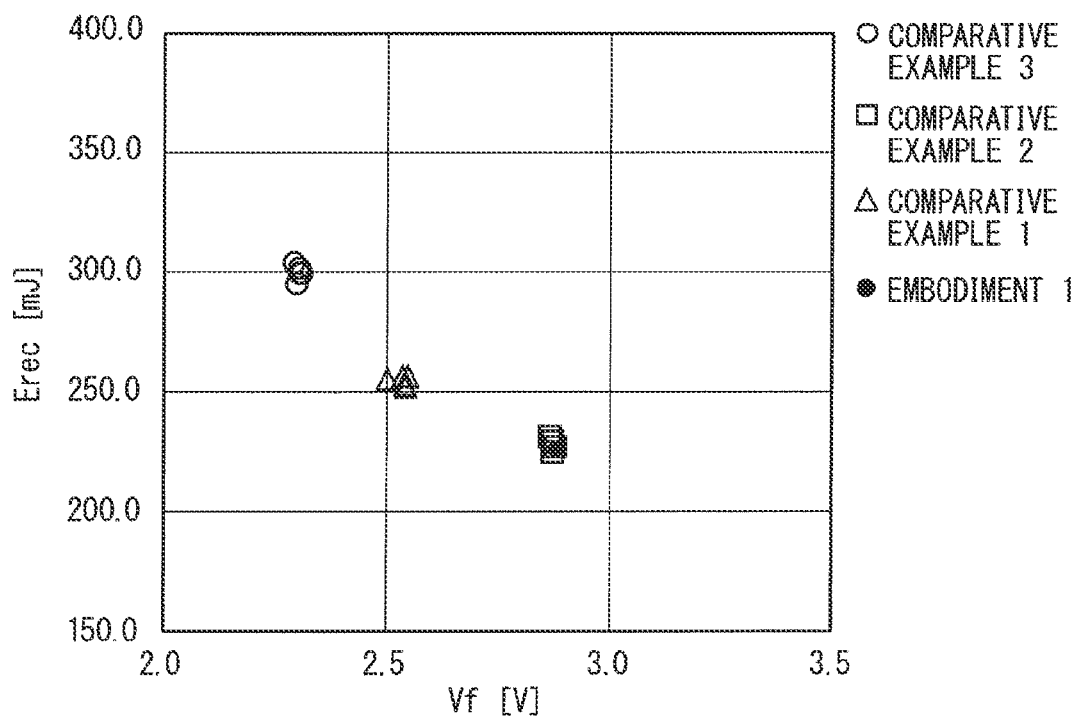
FIG. 5 is a diagram showing the relation between forward voltage drop and recovery loss of the semiconductor devices according to the embodiment 1 and the comparative examples.

FIG. 5 shows the trade-off relation between forward voltage drop Vf and the recovery loss Erec of the semiconductor devices of the embodiment 1, the comparative example 1, the comparative example 2, and a comparative example 3. In FIG. 5, the comparative example 3 represents the configuration in which a change to increase the P type impurity concentration of the P type diffusion layer 3z1 is made with respect to the comparative example 1. In the semiconductor device 10z1 of the comparative example 1, suppression of the decrease of the maximum recovery blocking power Prr is incompatible with the configuration with low Erec. In the semiconductor device of the comparative example 3, the forward voltage drop Vf is lower and the recovery loss Erec is larger compared to those of the comparative example 2. In the semiconductor device 10 of the current embodiment and the semiconductor device 10z2 of the comparative example 2, decrease of the maximum recovery blocking power Prr is suppressed and Erec is low. In the semiconductor device 10 of the current embodiment, Erec almost comparable to Erec of the semiconductor device 10z2 of the comparative example 2 is realized without forming lifetime killers by electron beam irradiation.

Figure 6:
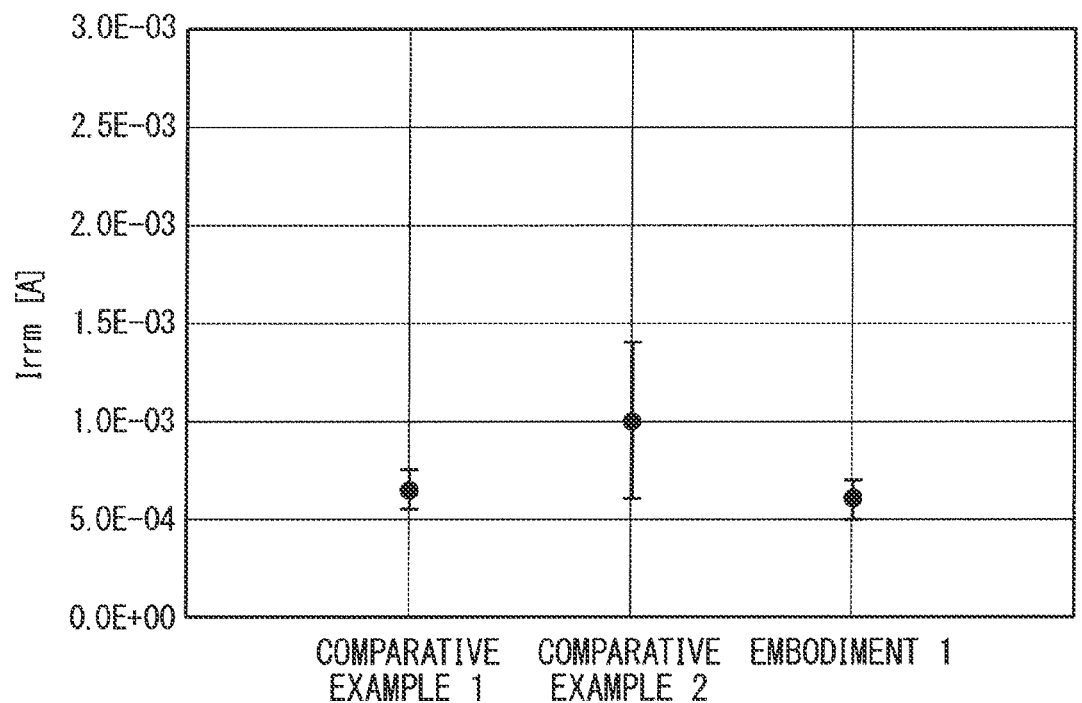
FIG. 6 is a diagram showing leak current of the semiconductor devices of the comparative examples and the embodiment 1.

FIG. 6 shows the leak current Irrm of the semiconductor devices of the comparative examples and the semiconductor device 10 of the embodiment 1. In FIG. 6, variation of the Irr among the products is shown with error bars. In the semiconductor devices 10z2 in which the lifetime killers 7 is formed by electron beam irradiation, the variation of the leak current among the products is increased, because the electron beam passes the N type diffusion layer 2 in the electron beam irradiation. As a result, in the semiconductor devices 10z2, the variation of the reverse recovery safe operation area (RRSOA) among products increases. In the semiconductor devices 10 of the current embodiment, the variation of the leak current is suppressed compared to that of the semiconductor devices 10z2. As a result, in the semiconductor devices 10 of the current embodiment, the variation of the RRSOA among products is suppressed.

<A-3. Thickness W of the P Type Diffusion Layer 3>

The thickness W of the P type diffusion layer 3 preferably is less than or equal to 20 μm because of the restriction by high-energy (namely, MeV class) ion implantation devices and the restriction by the time and temperature in thermal diffusion.

Lower limit of the thickness W of the P type diffusion layer 3 depends on usage of the semiconductor device 10, carrier lifetime of the N− type substrate 1, thickness $W_{N-}$ of the N− type substrate 1, and dose amount $D_A$ of the P type diffusion layer 3. The usage of the semiconductor device 10 means how are the current density J and power supply voltage $V_{cc}$ in the on-state, for example. In the following, lower limit of the thickness W of the P type diffusion layer 3 which is desirable for avoiding breakdown of the semiconductor device 10 is described.

<A-3-1. Causes of Breakdown of the Semiconductor Devices 10>

Causes of breakdown of the Semiconductor device 10 in recovery operations include current breakdown and voltage breakdown. There are three types of voltage breakdown: full depletion of the P type diffusion layer 3, dynamic avalanche, and overshoot of voltage.

The full depletion of the P type diffusion layer 3 occurs while the voltage $V_{ka}$, which is voltage between anode electrode 4 and cathode electrode 5, is rising toward the power supply voltage $V_{cc}$ after the voltage $V_{ka}$ changed from forward voltage to reverse voltage. The voltage $V_{ka}$ is defined to be positive when reverse voltage is applied. Low impurity concentration of the P type diffusion layer 3, high current density in on-state, long carrier lifetime in the N− type substrate 1, and the like make the full depletion of the P type diffusion layer 3 more likely to occur. The mechanism of the breakdown of the semiconductor device 10 by the full depletion of the P type diffusion layer 3 is as follows. Since the carrier concentration in the N− type substrate 1 is high, the depletion layer which extends toward the P type diffusion layer 3 from the border between the N− type substrate 1 and the P type diffusion layer 3 reach to the anode electrode 4. The anode layer is fully depleted without the electric field in the PN junction part 6, which is the border between the N− type substrate 1 and the P type diffusion layer 3, exceed the critical electric field. As a result, recovery current drastically increases in the depletion layer, and then the semiconductor device 10 is broken down.

The dynamic avalanche occurs while the $V_{ka}$ is rising toward the power supply voltage $V_{cc}$ after the voltage $V_{ka}$ changed from forward voltage to reverse voltage. High impurity concentration of P type diffusion layer 3, high current density in on-state, long carrier lifetime in the N− type substrate 1, and the like make the dynamic avalanche more likely to occur. The mechanism of the breakdown of the semiconductor device 10 by the dynamic avalanche is as follows. Since the carrier concentration in the P type diffusion layer 3 and the N− type substrate 1 is high, the electric field in the PN junction part 6, which is the border between the N− type substrate 1 and the P type diffusion layer 3, exceeds the critical electric field even though the $V_{ka}$ is lower than or equal to the static breakdown voltage, and then an avalanche breakdown occur.

The overshoot of voltage (also called snap off) occurs while the voltage $V_{ka}$ is rising beyond the power supply voltage $V_{cc}$ after the voltage $V_{ka}$ changed from forward voltage to reverse voltage. Low current density in on-state, short carrier lifetime in the N− type substrate 1, and the like make the overshoot of voltage more likely to occur. The mechanism of the breakdown of the semiconductor device 10 by the overshoot of voltage is as follows. The carrier concentration in the N− type substrate 1 drastically decrease, a voltage higher than the static breakdown voltage is instantly applied between the anode electrode 4 and the cathode electrode 5, the electric field in the PN junction part 6, which is the border between the N− type substrate 1 and the P type diffusion layer 3, exceeds the critical electric field, and then an avalanche breakdown occur.

In the following, lower limit of the thickness W of the P type diffusion layer 3 is derived as a condition to suppress the full depletion of the P type diffusion layer 3 among the voltage breakdown.

<A-3-2. Depletion of the P Type Diffusion Layer 3 in Recovery Operation>

The impurity concentration of the P type diffusion layer 3 is higher than the impurity concentration of the N− type substrate 1, and the former is $10^4$ to $10^7$ times as high as the latter, for example. As a result, when the reverse voltage is statically applied to the semiconductor device 10, the depletion layer around the border of the N− type substrate 1 and the P type diffusion layer 3 mainly extends toward the N− type substrate 1, and the extent of the depletion layer in the P type diffusion layer 3 is negligible.

On the other hand, how the depletion layer around the border of the N− type substrate 1 and the P type diffusion layer 3 extends during the recovery operation is different from that in the case where the reverse voltage is statically applied to the semiconductor device 10.

In the on-state of the semiconductor device 10, carriers flow into the N− type substrate 1 from the P type diffusion layer 3 and the N type diffusion layer 2, and conductivity modulation occurs. In the on-state of the semiconductor device 10, carrier concentration of the N− type substrate 1 is higher than the impurity concentration of the N− type substrate 1, and the former is $10^2$ to $10^5$ times as high as the latter. Immediately after the switching of the semiconductor device 10, namely immediately after the voltage applied to the semiconductor device 10 is changed from forward direction to reverse direction, the carrier concentration of the N− type substrate 1 remains high, and the carrier concentration of the N− type substrate 1 and the carrier concentration of the P type diffusion layer 3 are relatively close to each other. As a result, during the recovery operation after the switching of the semiconductor device 10, the depletion layer around the border between the N− type substrate 1 and the P type diffusion layer 3 extends both toward the N− type substrate 1 and toward the P type diffusion layer 3.

If the current in the on-state is high, since the carrier concentration of the N− type substrate 1 during the recovery operation is high, and thus the extent of the depletion layer in the P type diffusion layer 3 is large. If the impurity concentration of the P type diffusion layer 3 is low, the extent of the depletion layer in the P type diffusion layer 3 is large. For the purpose of increasing the switching speed of the semiconductor device 10, there are cases in which the impurity concentration of the P type diffusion layer 3 is set as low as the carrier concentration of the N− type substrate 1 in the on-state, for example.

In such cases, the depletion layer spread easily in the P type diffusion layer 3.

<A-3-3. Timing in which the Depletion Layer is Largest in the P Type Diffusion Layer 3 in Recovery Operation>

In recovery operation, if the voltage $V_{ka}$ between the anode electrode 4 and the cathode electrode 5 is high, the depletion layer is large. If the reverse current during the recovery operation is high, the electric charge density in the N− type substrate 1 is high, thus the depletion layer in the P type diffusion layer 3 is large. Therefore, when the voltage $V_{ka}$ and the reverse current is nearly highest during the recovery operation, the depletion layer in the P type diffusion layer 3 is largest and the semiconductor device 10 is more likely to be broken down due to the depletion of the P type diffusion layer 3.

Figure 10:
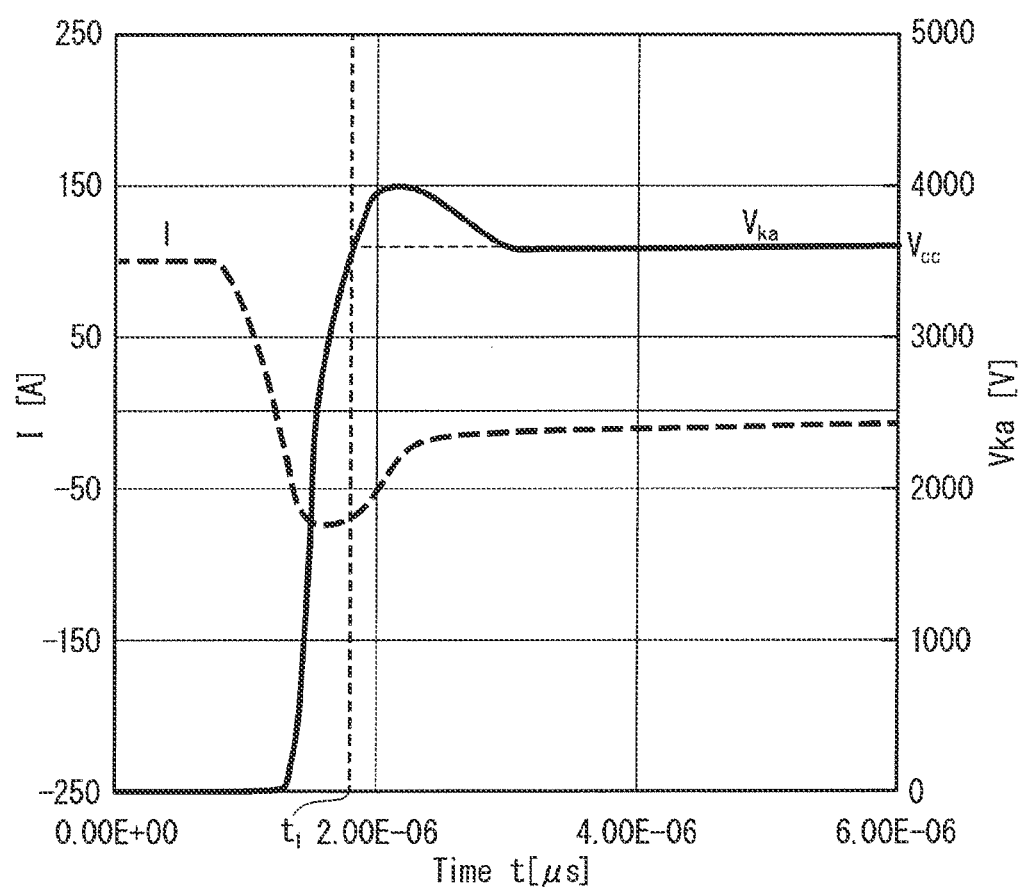
FIGS. 10 to 12 are diagrams showing the time dependence of current and voltage during recovery operation of the semiconductor device according to the embodiment 1.
Figure 11:
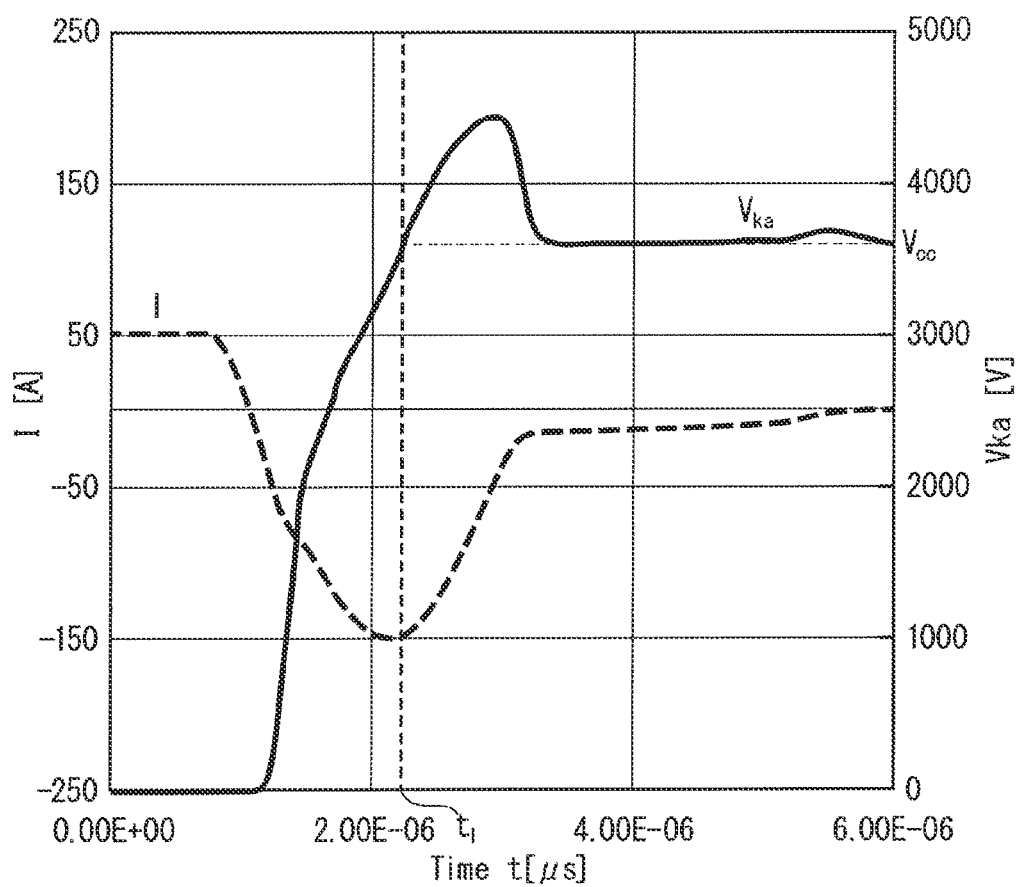
Figure 12:
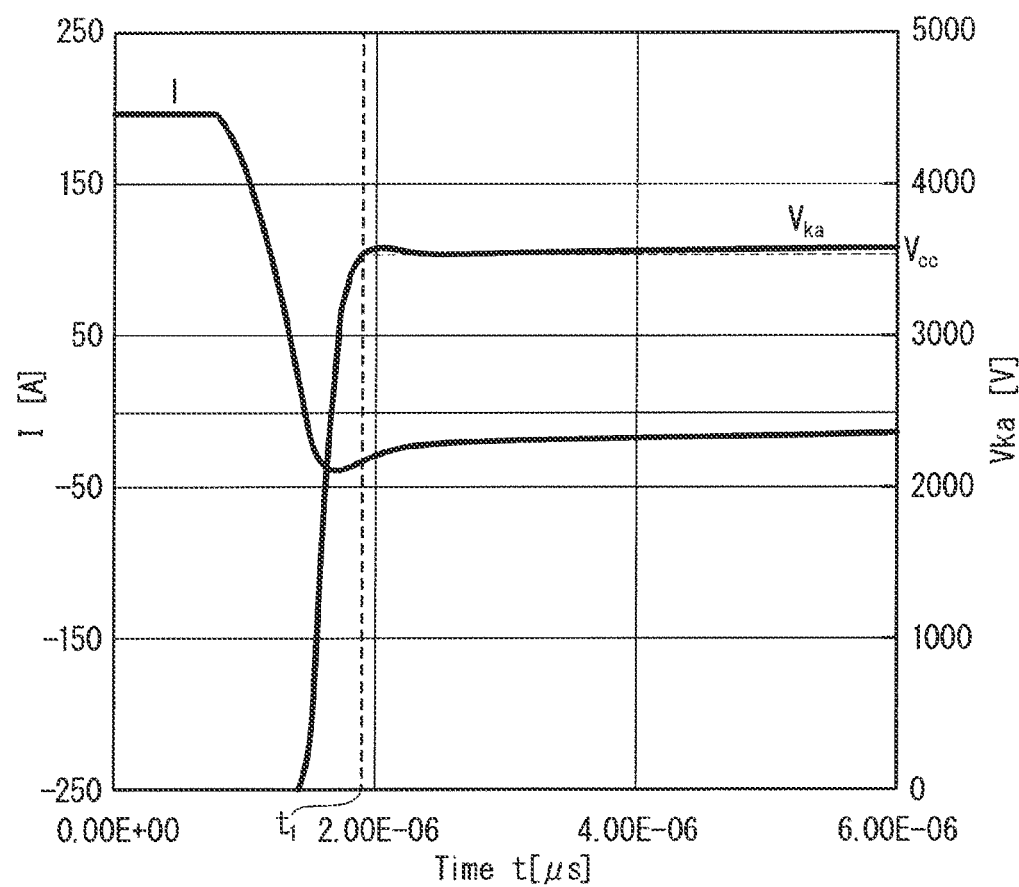

FIGS. 10 to 12 show the time dependence of the voltage $V_{ka}$ and the current 1 during the recovery operation of the semiconductor devices 10 with different configurations in the scope described in <A. Embodiment 1>. In FIGS. 10 to 12, the current 1 is defined to be positive when the current is forward current.

As shown in FIGS. 10 to 12, after the switching around time t=1 µs, absolute value of the current 1 take nearly maximum value around the time $t_1$ at which $V_{ka}$ is equal to the power supply voltage $V_{cc}$. Thus, it is approximately assumed that the depletion layer in the anode layer is largest when $V_{ka}$ is equal to the power supply voltage $V_{cc}$.

<A-3-4. Analysis of the Structural Factor of the Depletion of the P Type Diffusion Layer 3>

Based on the previous analysis, in the following, how the depletion layer in the P type diffusion layer 3 depends on the configuration of the semiconductor device 10 is analyzed. Based on the analysis in <A-3-3. Timing in which the Depletion Layer is Largest in the P Type Diffusion Layer 3 in Recovery Operation>, width $W_A$ of the depletion layer in the P type diffusion layer 3 in a state (hereafter referred to as the state S) in which the reverse voltage which is equal to $V_{cc}$ is applied to the PN junction part 6 during a recovery operation is considered.

Figure 13:
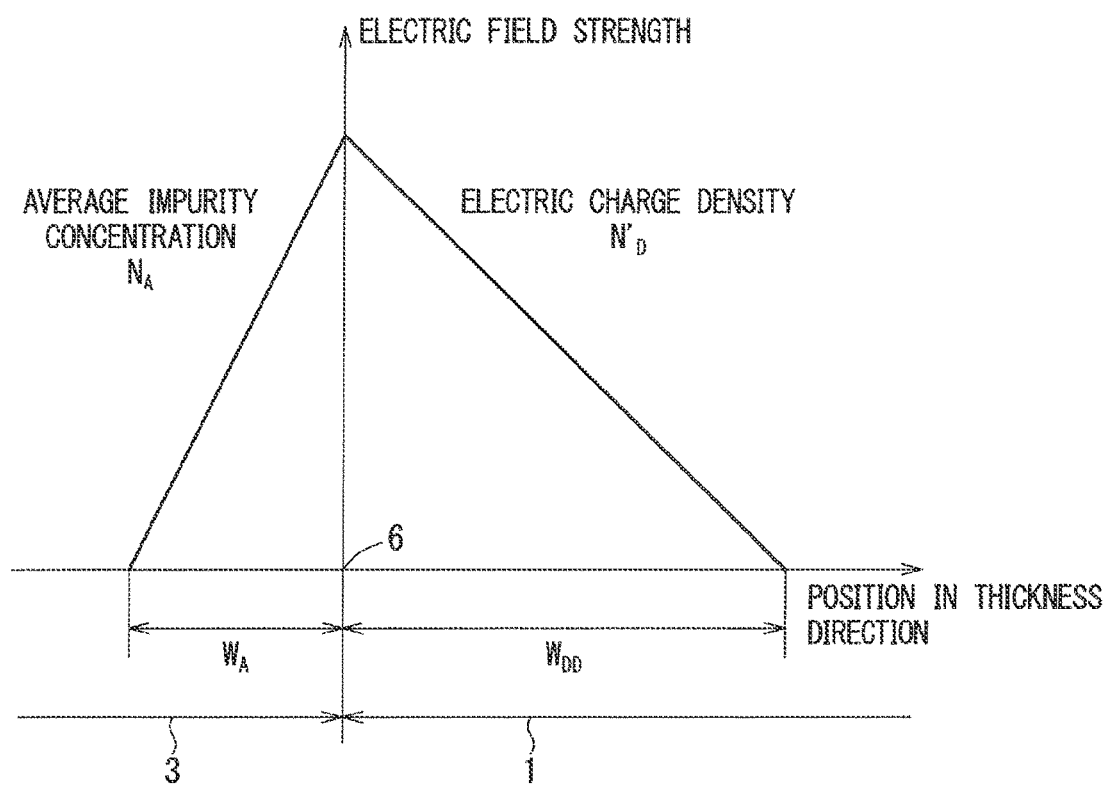
FIG. 13 is a diagram showing the electric field distribution around the PN junction part 6, which is the border between the N− type substrate 1 and the P type diffusion layer 3, in the semiconductor device according to the embodiment 1.

FIG. 13 shows the electric field distribution around the PN junction part 6, which is the border between the N− type substrate 1 and the P type diffusion layer 3, in the state S. For analyzing, the PN junction part 6 is modelized as an abrupt PN junction, namely, electric charge distribution around the PN junction part 6 change stepwise. Based on the Poisson's equation, the voltage $V_{cc}$ applied to the PN junction part 6 in the state S, the average impurity concentration $N_A$ in the P type diffusion layer 3, the width $W_A$ of the depletion layer in the P type diffusion layer 3 in the state S, the electric charge density $N'_D$ in the depletion layer in the N− type substrate 1 in the state S, and the width $W_{DD}$ of the depletion layer in the N− type substrate 1 in the state S satisfy following relations shown in Formula 1 and Formula 2.

$$V_{cc} = \frac{1}{2}\frac{qN_A}{\epsilon_s\epsilon_0}W_A^2 + \frac{1}{2}\frac{qN'_D}{\epsilon_s\epsilon_0}W_{DD}^2 \quad \text{<Formula 1>}$$

$$\frac{qN_A}{\epsilon_s\epsilon_0}W_A = \frac{qN'_D}{\epsilon_s\epsilon_0}W_{DD} \quad \text{<Formula 2>}$$

Here, q is the elementary charge, $\epsilon_s$ is relative permittivity of the semiconductor material of the P type diffusion layer 3 and the N− type substrate 1, and $\epsilon_0$ is the vacuum permittivity. $N_A$ is average impurity concentration of the P type diffusion layer 3. For the purpose of approximate modeling, unevenness of the P type impurity concentration of the P type diffusion layer 3 with respect to the position in the thickness direction is neglected, and the average impurity concentration $N_A$ is used.

From Formula 2, Formula 1 leads to Formula 3.

$$V_{cc} = \frac{1}{2}\frac{qN_A}{\epsilon_s\epsilon_0}W_A^2 + \frac{1}{2}\frac{qN'_D}{\epsilon_s\epsilon_0}\left(\frac{N_A W_A}{N'_D}\right)^2 \quad \text{<Formula 3>}$$

From Formula 3, the width $W_A$ of the depletion layer in the P type diffusion layer 3 in the state S is obtained as Formula 6, through Formula 4 and Formula 5.

$$V_{cc} = \frac{1}{2}\frac{qN_A}{\epsilon_s\epsilon_0}W_A^2 + \frac{1}{2}\frac{qN_A^2}{\epsilon_s\epsilon_0 N'_D}W_A^2 \quad \text{<Formula 4>}$$

$$\frac{2\epsilon_s\epsilon_0 V_{cc}}{qN_A} = W_A^2 + \frac{N_A}{N'_D}W_A^2 \quad \text{<Formula 5>}$$

$$W_A = \sqrt{\frac{2\epsilon_s\epsilon_0 V_{cc}}{qN_A\left(1+\frac{N_A}{N'_D}\right)}} \quad \text{<Formula 6>}$$

To avoid the full depletion of the P type diffusion layer 3, it is necessary that the thickness W of the P type diffusion layer 3 is larger than the width $W_A$ of the depletion layer in the P type diffusion layer 3. Thus, the thickness W of the P type diffusion layer 3 is preferably satisfies the condition of Formula 7.

$$W > W_A = \sqrt{\frac{2\epsilon_s\epsilon_0 V_{cc}}{qN_A\left(1+\frac{N_A}{N'_D}\right)}} \quad \text{<Formula 7>}$$

In the following, the condition of Formula 7 is transformed into the form which does not include the electric charge density $N'_D$ in the depletion layer in the N− type substrate 1 in the state S.

To that end, at first, relation is considered between average carrier concentration $n_{Avg}$ in the N− type substrate 1 in on-states before switching, current density J in on-states before switching, and lifetime $\tau$ of the carrier whose conductivity type is same with the P type diffusion layer 3 (namely, the P type carrier) in the N− type substrate 1, and the thickness $W_{N-}$ of the N− type substrate 1.

Figure 14:
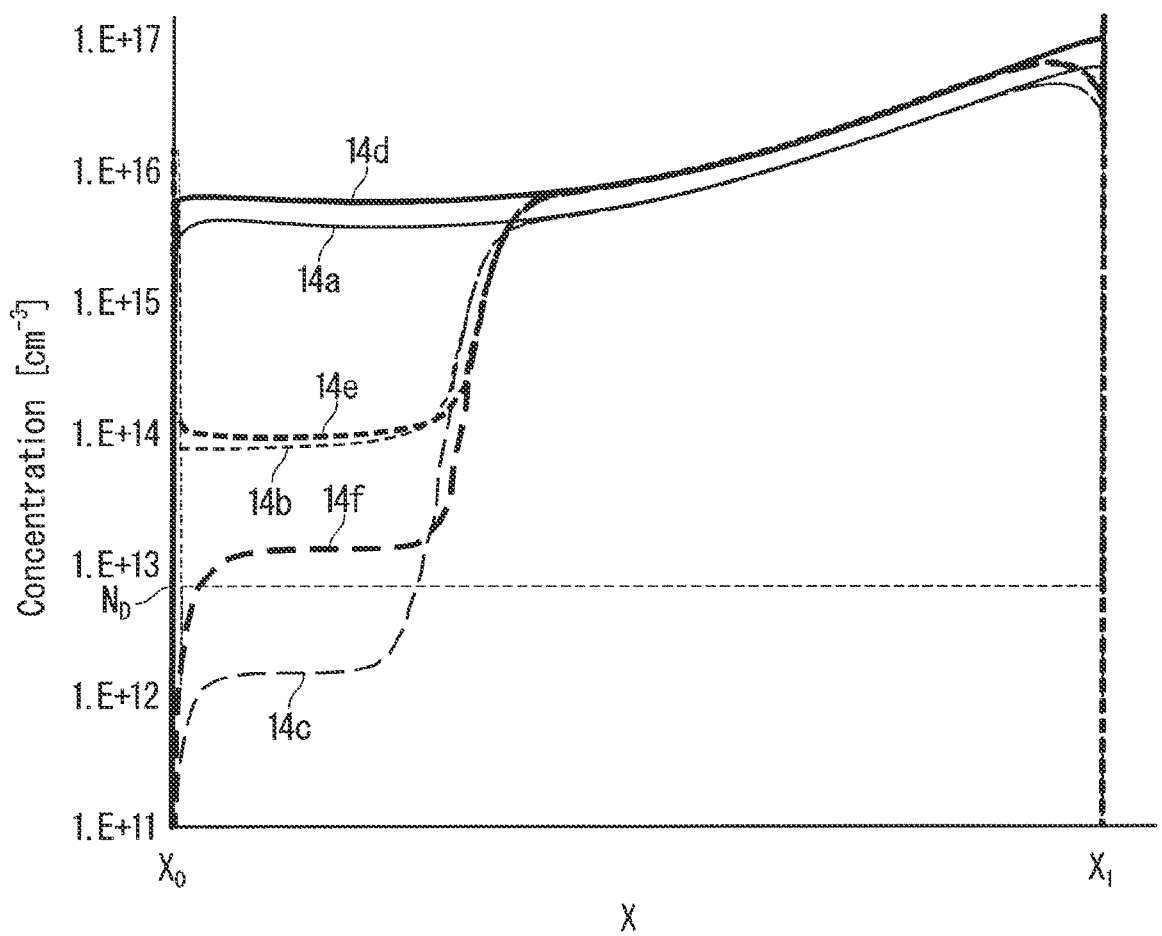
FIGS. 14 to 16 are diagrams showing carrier concentrations in in on-states and recovery states in the semiconductor device according to the embodiment 1.
Figure 15:
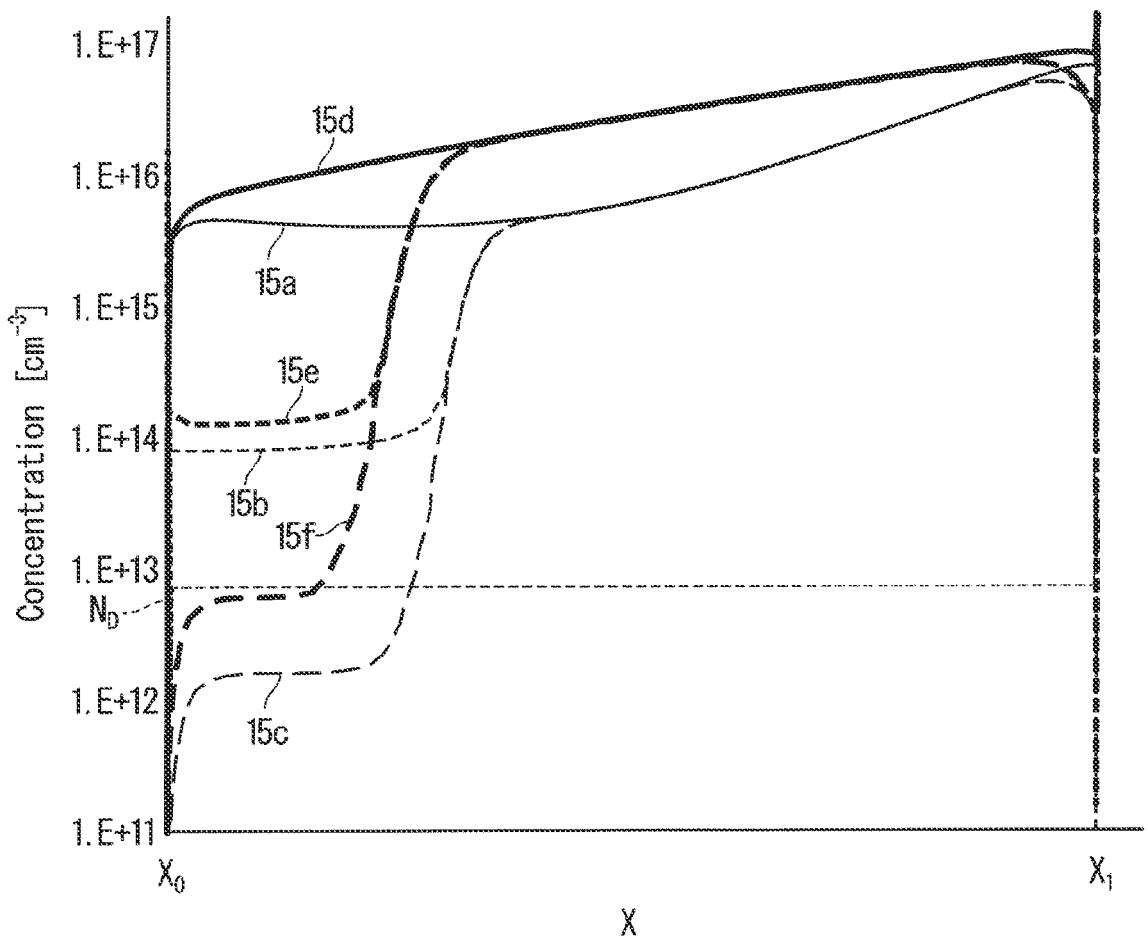
Figure 16:
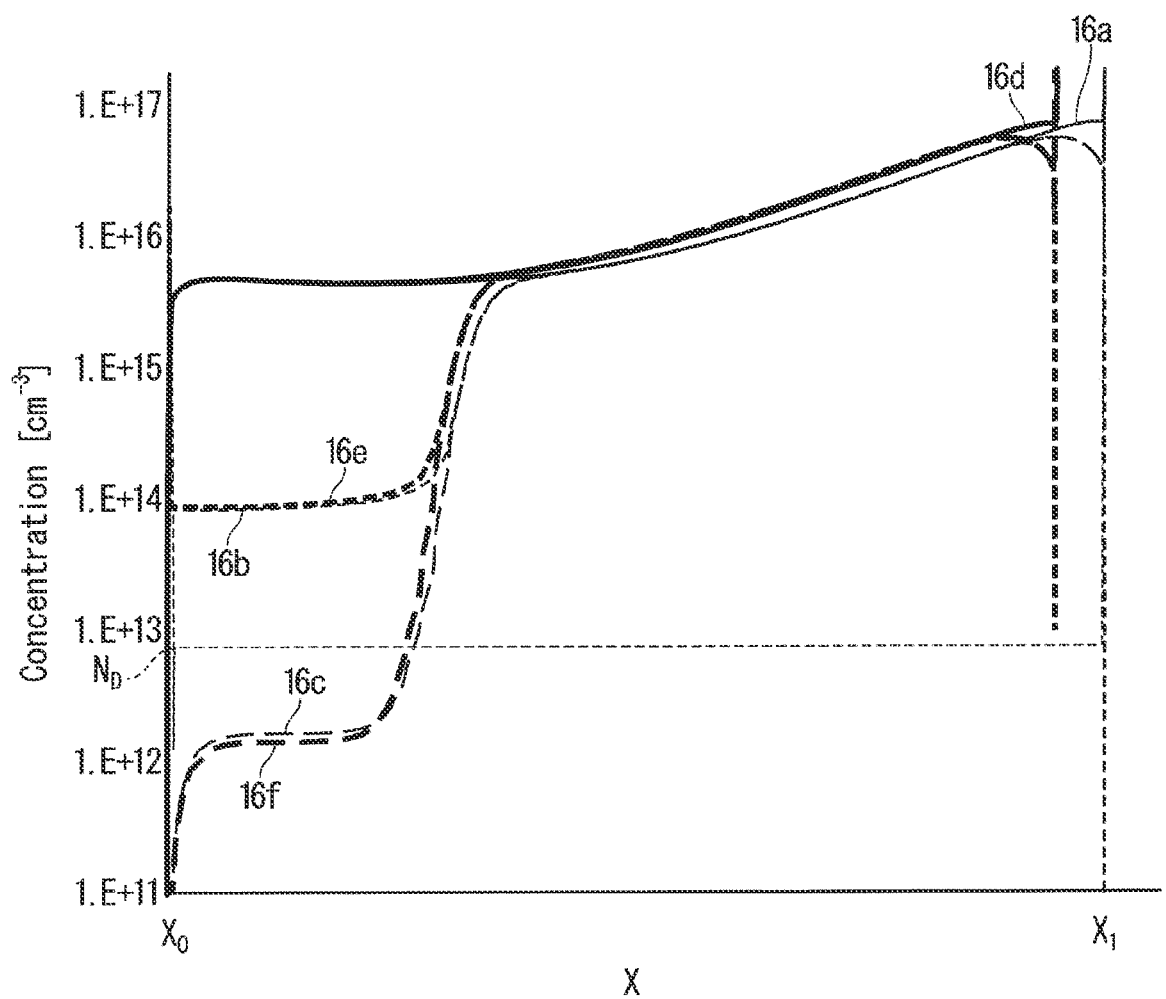

FIGS. 14 to 16 represent carrier concentrations in the N− type substrate 1 in on-states and recovery states of the semiconductor device 10. In the on-states, since electron concentration and hole concentration are nearly the same, both of the electron concentration and the hole concentration are shown as carrier concentration by the same line in the figures.

FIG. 14 shows data in the case where the current density in the on-state is low (lines 14a, 14b, and 14c in FIG. 14) and in the case where the current density in the on-state is high (lines 14d, 14e, and 14f in FIG. 14).

FIG. 15 shows data in the case in which the carrier lifetime of the P type carrier in the N− type substrate 1 is short (lines 15a, 15b, and 15c in FIG. 15) and in the case in which the carrier lifetime of the P type carrier in the N− type substrate 1 is long (lines 15d, 15e, and 15f in FIG. 15).

FIG. 16 shows data in the case in which the N− substrate 1 is thick (lines 16a, 16b, and 16c in FIG. 16) and in the case in which the N− substrate 1 is thin (lines 16d, 16e, and 16f in FIG. 16).

In FIGS. 14 to 16, lines 14a, 15a, 16a, 14d, 15d, and 16d represent the carrier concentrations in the on-states.

In FIGS. 14 to 16, lines 14b, 15b, 16b, 14e, 15e, and 16e represent hole concentrations during the recovery states.

In FIGS. 14 to 16, line 14c, 15c, 16c, 14f, 15f, and 16f represent the hole concentrations during the recovery states.

In FIGS. 14 to 16, horizontal axis X represents positions in thickness direction of the N− type substrate 1. In FIGS. 14 and 15, X=X₀ represents the border between the N− type substrate 1 and the P type diffusion layer 3, and X=X₁ represents border between the N− type substrate 1 and the N type diffusion layer 2. In FIG. 16, X=X₀ represents border between the N− type substrate 1 and the P type diffusion layer 3, and X=X₁ represents the border between the N− type substrate 1 and the N type diffusion layer 2 in the case in which the N− type substrate 1 is thick.

In FIGS. 14 to 16, each data of the recovery states is data in the moment when the voltage $V_{ka}$ between the anode electrode 4 and the cathode electrode 5 take the same certain value in the recovery state.

From FIGS. 14 to 16, following relations (a), (b), and (c) are derived.

(a) The higher the current density J in the on-state is, the higher the carrier concentration in the N− type substrate 1 in the on-state is.

(b) The longer the carrier lifetime c of the P type carrier in the N− type substrate 1 is, the higher the carrier concentration in the N− type substrate 1 in the on-state is.

(c) The thinner the thickness $W_{N-}$ of the N− type substrate 1 is, the higher the carrier concentration in the N− type substrate 1 in the on-state is.

Therefore, the average carrier concentration $n_{Avg}$ in the N− type substrate 1 in the on-state is approximately represented by using the current density J in the on-state, the carrier lifetime τ of the P type carrier in the N− type substrate 1, and the thickness $W_{N-}$ of the N− type substrate 1. Following relation in Formula 8 is known (e.g. refer to Baliga, B. Jayant, "Fundamentals of Power Semiconductor Devices", p.212, Springer, 2008).

$$n_{avg} = \frac{J\tau}{2qW_{N-}} \qquad \text{<Formula 8>}$$

Next, we derive the relation between the electric charge density $N'_D$ in the depletion layer in the N− type substrate 1 in the state S and the average carrier concentration $n_{Avg}$ in the N− type substrate 1 in the on-state. The electric charge density $N'_D$ in the depletion layer in the N− type substrate 1 in the state S can be represented as sum of four elements as shown in Formula 9.

$$N'_D = p - n + N_D - R \qquad \text{<Formula 9>}$$

Here, p is the hole concentration in the N− type substrate 1 in the state S, n is the electron concentration in the N− type substrate 1 in the state S, and $N_D$ is the impurity concentration of the N− type substrate 1. R represents contribution of electrons and holes to the electric charge density which are captured in deep levels in the N− type substrate 1 in the state S. R is obtained by subtracting the concentration of holes captured in the deep levels from the concentration of electrons captured in the deep levels. In a recombination in the deep levels, one electron and one hole recombinate. Nevertheless, during the process of recombinations, the number of electrons and holes trapped in the deep levels are different, thus the electrons and holes trapped in the deep levels contributes to electric charge as a whole.

From FIGS. 14 to 16, it can be seen that p≫$N_D$ and p>n. Thus, Formula 9 leads to Formula 10.

$$N'_D \approx p - n - R \qquad \text{<Formula 10>}$$

From FIGS. 14 to 16, it can be seen that the higher the average carrier concentration $n_{Avg}$ in the N− type substrate 1 in the on-state is, the higher the carrier concentration in the depletion layer in the N− type substrate 1 in the state S is.

From FIGS. 14 to 16, it can be also seen that the carrier concentration in the depletion layer in the N− type substrate 1 in the state S depends on the average carrier concentration $n_{Avg}$ in the N− type substrate 1 in the on-state.

The contribution R to the electric charge density from electrons and holes which are captured in deep levels in the N− type substrate 1 depends on the carrier lifetime τ of the hole in the N− type substrate 1. Thus, the relation between $N'_D$ and $n_{Avg}$ is approximately represented as Formula 11.

$$N'_D = \alpha(\tau)n_{Avg} \qquad \text{<Formula 11>}$$

Here, α(τ) is factor of proportionality empirically obtained. From a fitting to simulation results, we obtained the expression in Formula 12.

$$\alpha(\tau) = \frac{4.15}{(\ln(2.85\tau + 1))^{4.77} + 225} \qquad \text{< Formula 12 >}$$

Figures 17, 18:
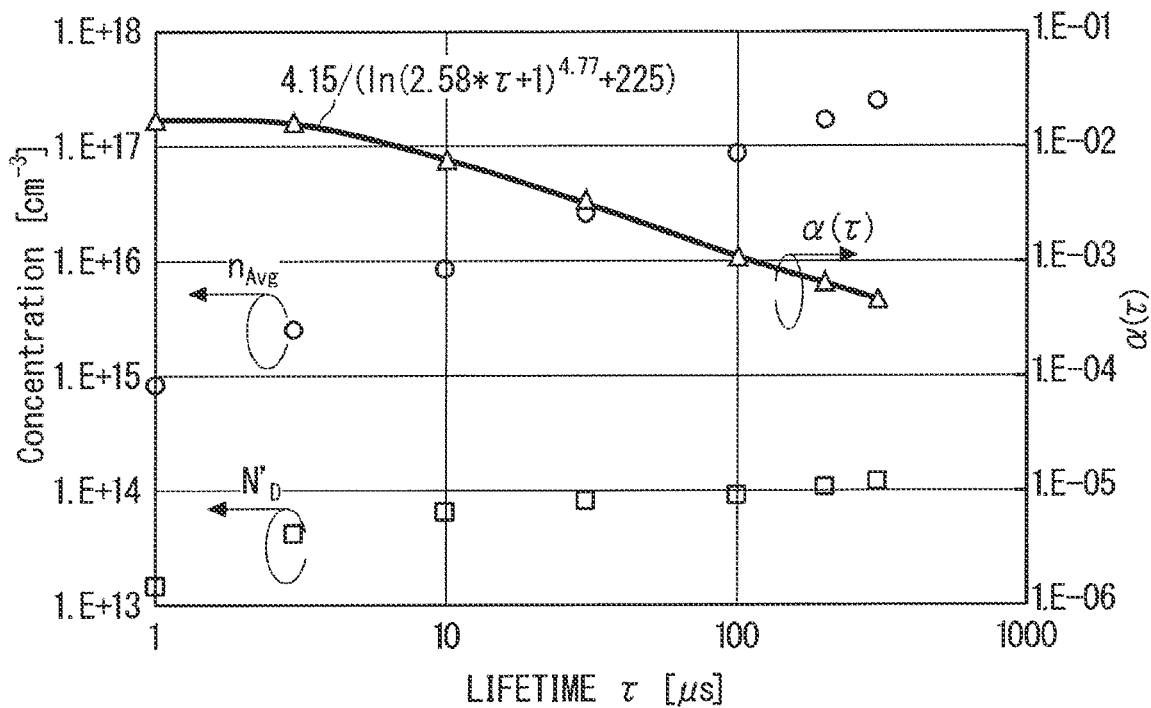
FIG. 17 is a diagram showing the factor of proportionality $\alpha(\tau)$ which is empirically obtained.
FIG. 18 is a diagram showing a representative value of the power supply voltage for each of the rated voltages in the semiconductor devices according to the embodiment 1.

In the right hand side of Formula 12, τ represents the value when τ is represented in the unit of μs. FIG. 17 shows α(τ) obtained by the simulations and Formula 12 obtained by the fitting. In FIG. 17, α(τ) obtained by the simulations are shown in open triangles, and Formula 12 is shown in by a solid line. Differences between Formula 12 and α(τ) obtained by the simulations are within 5%. FIG. 17 also shows $N'_D$ and $n_{Avg}$ obtained by simulations.

By using Formula 8 and Formula 12, Formula 7 leads to Formulae 13 to 15.

$$W > \sqrt{\frac{2\epsilon_s\epsilon_0 V_{cc}}{qN_A\left(1 + \frac{N_A}{\alpha(\tau)n_{avg}}\right)}} \qquad \text{< Formula 13 >}$$

$$W > \sqrt{\frac{2\epsilon_s\epsilon_0 V_{cc}}{qN_A\left(1 + \frac{N_A}{\alpha(\tau)\frac{J\tau}{2qW_{N-}}}\right)}} \qquad \text{< Formula 14 >}$$

$$W > \sqrt{\frac{2\epsilon_s\epsilon_0 V_{cc}}{qN_A\left(1 + \frac{2qW_{N-}N_A}{\alpha(\tau)n_{avg}}\right)}} \qquad \text{< Formula 15 >}$$

The average impurity concentration $N_A$ in the P type diffusion layer 3, the dose amount $D_A$, and the thickness W of the P type diffusion layer 3 satisfy the relation of Formula 16.

$$N_A = \frac{D_A}{W_D} \qquad \text{< Formula 16 >}$$

Therefore Formula 15 is rewritten as Formulae 17 to 20 by using Formula 16.

$$W > \sqrt{\frac{2\epsilon_s\epsilon_0 V_{cc}}{q\frac{D_A}{W}\left(1 + \frac{2qW_{N-}D_A}{\alpha(\tau)J\tau W}\right)}} \qquad \text{< Formula 17 >}$$

$$W^2 > \frac{2\epsilon_s\epsilon_0 V_{cc}}{q\frac{D_A}{W}\left(1 + \frac{2qW_{N-}D_A}{\alpha(\tau)J\tau W}\right)} \qquad \text{< Formula 18 >}$$

-continued $$W^2 \frac{1}{W}\left(1 + \frac{2qW_{N-}D_A}{\alpha(\tau)J\tau W}\right) > \frac{2\epsilon_s\epsilon_0 V_{cc}}{qD_A} \quad <\text{Formula 19}>$$

$$W + \frac{2qW_{N-}D_A}{\alpha(\tau)J\tau} > \frac{2\epsilon_s\epsilon_0 V_{cc}}{qD_A} \quad <\text{Formula 20}>$$

From the above argument, it is desirable that the thickness W of the P type diffusion layer 3 satisfies the relation of Formula 20 to suppress the full depletion of the P type diffusion layer 3 during the recovery operation.

After the switching, $V_{ka}$ temporarily becomes higher than the power supply voltage $V_{cc}$, as shown in FIGS. 10 to 12 for example. In order for $V_{ka}$ not to exceed rated voltage, the power supply voltage $V_{cc}$ when the semiconductor device 10 is used is set to be lower than the rated voltage $V_r$. FIG. 18 shows a representative value of the power supply voltage $V_{cc}$ assumed for each of the rated voltages $V_r$ of the semiconductor devices 10. For example, in the case where the thickness W of the P type diffusion layer 3 satisfies the condition obtained by substituting 0.8 times the rated voltages $V_r$ for the power supply voltage $V_{cc}$ in Formula 20, the full depletion of the P type diffusion layer 3 during the recovery operation of the semiconductor device 10 is suppressed when the power supply voltage $V_{cc}$ shown in FIG. 18 is used. In the case where the thickness W of the P type diffusion layer 3 satisfies the condition obtained by substituting 0.9 times the rated voltages $V_r$ for the power supply voltage $V_{cc}$ in Formula 20, the full depletion of the P type diffusion layer 3 during the recovery operation of the semiconductor device 10 is further suppressed.

Rated current density $J_r$ may be used as the current density J in the on-state. Since the full depletion of the P type diffusion layer 3 occur in the case when the current in the on-state just before the switching is high, a case where the current density J in the on-state just before the switching is higher than the rated current density $J_r$ may be taken into account, to secure a design margin. A representative value of the current density J assumed as a high current density in the on-state just before the switching is 2.5 times the rated current density $J_r$, for example.

FIG. 19 shows the rated current density $J_r$ which is representative value assumed and 2.5 times the rated current density $J_r$, which is the representative value of the current density assumed as a high current density in the on-state just before the switching, for each of the rated voltages $V_r$ of the semiconductor devices 10.

By assuming 2.5 times the rated current density $J_r$ as the current density J in the on-state just before the switching, the full depletion of the P type diffusion layer 3 is suppressed in the case when a large current is flowing in the on-state just before the switching. By assuming 3 times the rated current density $J_r$ as the current density J in the on-state just before a switching, the full depletion of the P type diffusion layer 3 is further suppressed.

In the case where the power supply voltage $V_{cc}$ is assumed as 0.8 times the rated voltage $V_r$ and the current density J in the on-state just before the switching is assumed as 2.5 times the rated current density $J_r$, the thickness W of the P type diffusion layer 3 satisfies $$W > \frac{1.6\epsilon_s\epsilon_0 V_r}{qD_A} - \frac{2qW_{N-}D_A}{2.5\alpha(\tau)J_r\tau} \quad <\text{Formula 21}>$$

Thereby, the full depletion of the P type diffusion layer 3 during the recovery operation of high current and high voltage in the semiconductor device 10 is suppressed.

In the case where the power supply voltage $V_{cc}$ is assumed as 0.9 times the rated voltage $V_r$ and the current density J in the on-state just before the switching is assumed as 2.5 times the rated current density $J_r$, the thickness W of the P type diffusion layer 3 satisfies $$W > \frac{1.8\epsilon_s\epsilon_0 V_r}{qD_A} - \frac{2qW_{N-}D_A}{2.5\alpha(\tau)J_r\tau} \quad <\text{Formula 22}>$$

In the case where the power supply voltage $V_{cc}$ is assumed as 0.8 times the rated voltage $V_r$ and the current density J in the on-state just before the switching is assumed as 3 times the rated current density $J_r$, the thickness W of the P type diffusion layer 3 satisfies $$W > \frac{1.6\epsilon_0 V_r}{qD_A} - \frac{2qW_{N-}D_A}{3\alpha(\tau)J_r\tau} \quad <\text{Formula 23}>$$

In the case where the power supply voltage $V_{cc}$ is assumed as 0.9 times the rated voltage $V_r$ and the current density J in the on-state just before the switching is assumed as 3 times the rated current density $J_r$, the thickness W of the P type diffusion layer 3 satisfies $$W > \frac{1.8\epsilon_s\epsilon_0 V_r}{qD_A} - \frac{2qW_{N-}D_A}{3\alpha(\tau)J_r\tau} \quad <\text{Formula 24}>$$

The problem of the full depletion of the P type diffusion layer 3 during the recovery operation of high current and high voltage is more likely to occur in semiconductor devices for high-speed application (e.g. for electric trains), than in semiconductor devices for low-speed application (e.g. for electric power system). In the semiconductor device 10 having the configuration described in the current embodiment, even if it is for high-speed application, the full depletion of the P type diffusion layer 3 during the recovery operation of large current and large voltage can be suppressed, and breakdown of the semiconductor device 10 by the full depletion of the P type diffusion layer 3 is suppressed.

The rated current density $J_r$ is obtained by dividing the rated current of the semiconductor device 10 by the area of the active region, namely the region where the current flows, in the plan view. In the case where the semiconductor devices 10 is combined with a transistor as in the case of RC-IGBT, the rated current density $J_r$ is obtained by dividing the rated current of the forward direction of the diode by the area of the active region of the diode which includes the N− type substrate 1, the N type diffusion layer 2, and the P type diffusion layer 3.

FIG. 20 shows a representative value of the thickness $W_{N-}$ of the N− type substrate 1 for each of the rated voltages of the semiconductor devices 10.

For the purpose of lowering the switching loss of the semiconductor device 10, it is desirable that the maximum value of the impurity concentration of the P type diffusion layer 3 is less than or equal to 1.0E17 cm$^{-3}$. Accordingly, it is desirable that the dose amount $D_A$ of the P type diffusion layer 3 is determined so that the maximum value of the impurity concentration of the P type diffusion layer 3 is less than or equal to 1.0E17 cm$^{-3}$.

In the derivations of Formulae 21 to 24, it is assumed that the P type impurity concentration in P type diffusion layer 3 is constant with respect to the thickness direction. Accordingly, it is desirable that the impurity concentration distribution of the P type diffusion layer 3 with respect to the thickness direction is not too different from the assumption. Namely, it is desirable that the minimum value of the P type impurity concentration in the P type diffusion layer 3b is larger than or equal to the 1/10 times the maximum value of the impurity concentration of the P type diffusion layer 3a, and is larger than or equal to the 1/10 times the maximum value of the impurity concentration of the P type diffusion layer 3c. The same holds for the case where impurity concentration distribution of the P type diffusion layer 3 with respect to the thickness direction has more than two peaks. Namely, in the region of the P type diffusion layer 3 which locates between the peak closest to the first main surface 100a and the peak closest to the second main surface 100b among the peaks of the impurity concentration distribution of the P type diffusion layer 3 with respect to the thickness direction, it is desirable that the minimum value of the impurity concentration of the region is larger than 1/10 times of the maximum value of the impurity concentration distribution in the P type diffusion layer 3 with respect to the thickness direction.

<A-4. Manufacturing Method>

Figure 23:
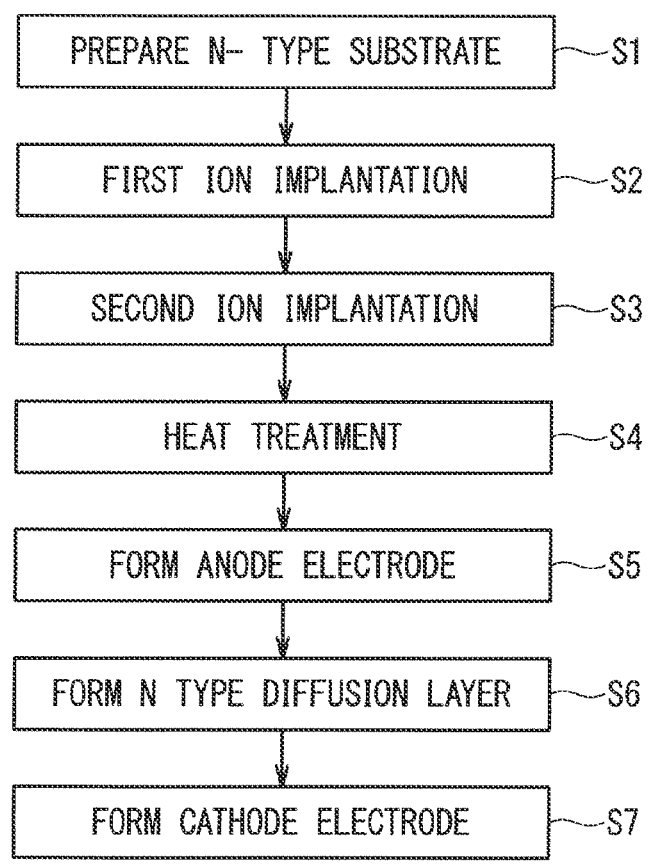
FIG. 23 is a flowchart showing a manufacturing method of a semiconductor device according to embodiments 1.

FIG. 23 is a flowchart showing a manufacturing method of the semiconductor device 10.

Figure 7:
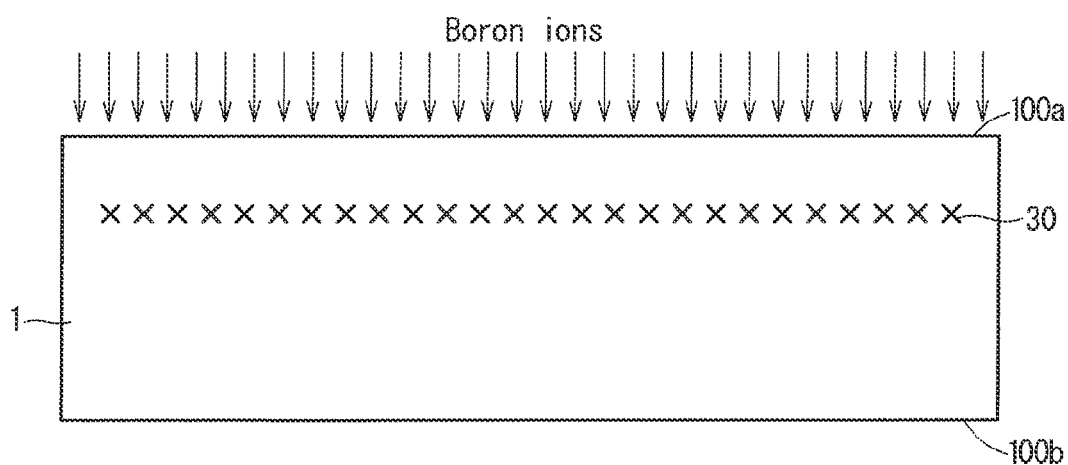
FIGS. 7 to 9 are diagrams showing a state of the semiconductor device during manufacturing in the manufacturing method according to the embodiment 1.
Figure 8:
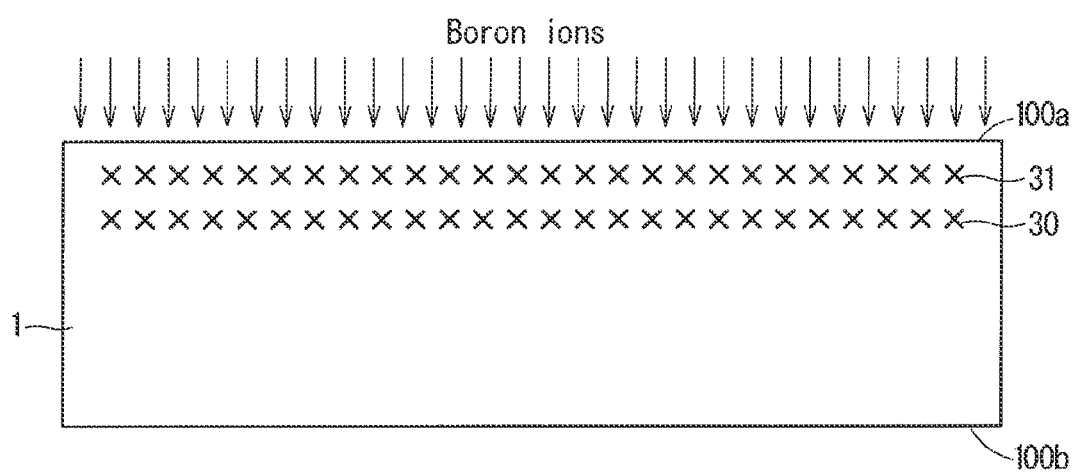
Figure 9:
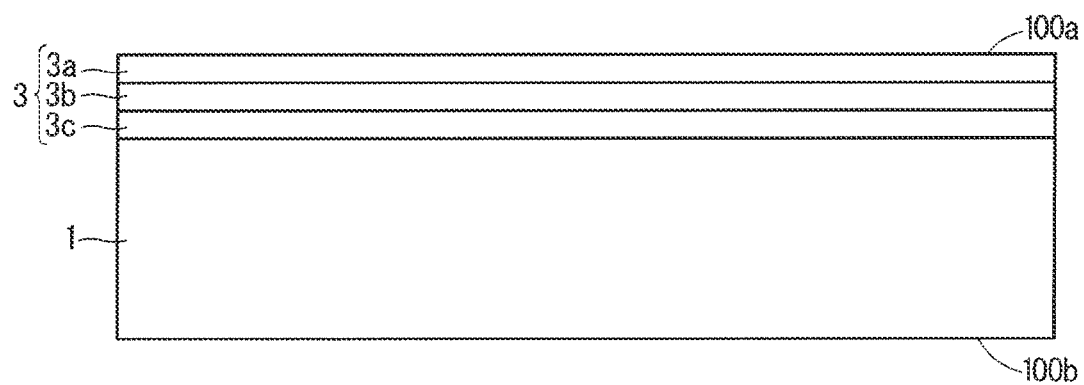

FIGS. 7 and 8 show a state in a process of the manufacturing of the semiconductor device 10.

First, in step S1, the N− type substrate 1 is prepared.

Next, in step S2, first ion implantation is performed into the surface layer of the first main surface 100a side of the N− type substrate 1 (see FIG. 7). As a result, impurity-introduced region 30 is formed in the N− type substrate 1. The ions implanted into the N− type substrate 1 in step S2 are boron, for example.

Next, in step S3, second ion implantation is performed into the surface layer of the first main surface 100a side of the N− type substrate 1 (see FIG. 8). As a result, impurity-introduced region 31 is formed in the N− type substrate 1. In step S3, ions are implanted into the region which is shallower than the region into which ions are implanted in the ion implantation in step S2. The ions implanted into the N− type substrate 1 in step S3 are boron, for example.

Next, in step S4, by heat treatment, the impurities implanted in step S2 and step S3 are activated. As a result, the P type diffusion layer 3 is formed (see FIG. 1).

Next, in step S5, anode electrode 4 is formed.

Next, in step S6, N type diffusion layer 2 is formed by ion implantation and heat treatment.

Next, in step S7, cathode electrode 5 is formed.

Through the processes described above, semiconductor device 10 shown in FIG. 1 is obtained.

In the manufacturing method of the semiconductor device of the present embodiment, the thickness W of the P type diffusion layer 3 is decided to satisfy Formula 21. In step S2 and step S3, for example, by adjusting energy of ion beam, the depth of the ion implantation can be adjusted and the thickness W of the P type diffusion layer 3 can be adjusted.

By adjusting the amount of the ions implanted in step S2 and step S3, impurity concentration at the peak of the impurity concentration distribution of the P type diffusion layer 3 can be adjusted.

As described above, in the manufacturing method of the semiconductor device of the present embodiment, the relation between the average carrier concentration $n_{Avg}$ in the N− type substrate 1 in the on-state and electric charge concentration in the depletion layer around the border of the N− type substrate 1 and the P type diffusion layer 3 among the N− type substrate 1 in the recovery process is obtained, and then the thickness of the P type diffusion layer 3 is decided based on the relation.

B. Second Embodiment

Figure 2:
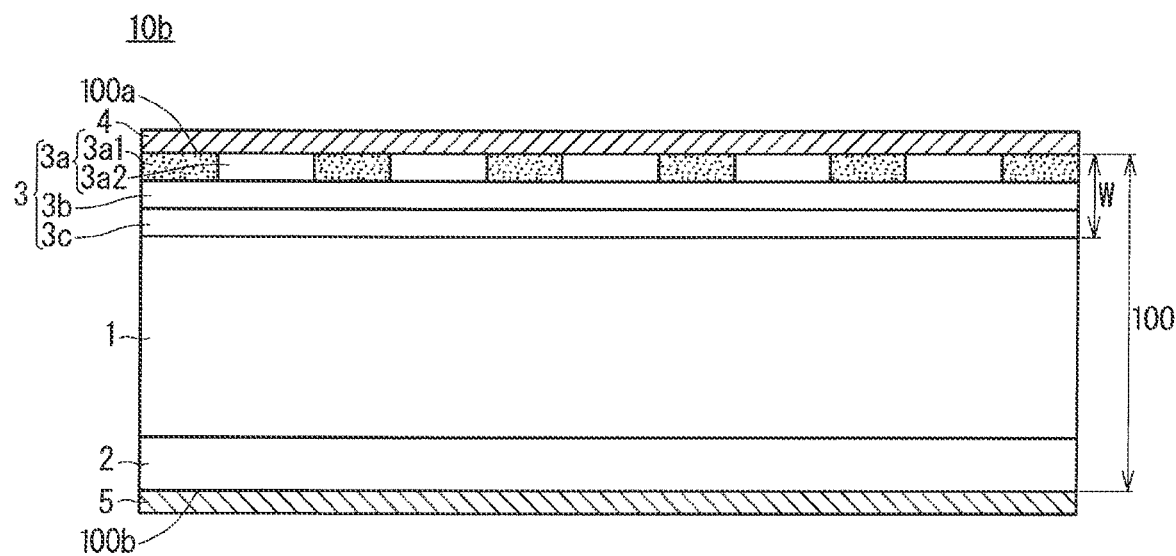
FIG. 2 is a diagram showing a semiconductor device according to the embodiment 2.

FIG. 2 shows a semiconductor device 10b of the second embodiment.

In the semiconductor device 10b, the impurity concentration of the P type diffusion layer 3a varies depending on in-plane position. With respect to other aspects, the semiconductor device 10b is the same with the semiconductor device 10 of the embodiment 1.

In the semiconductor device 10b, the P type diffusion layer 3a includes P type diffusion layers 3a1 and P type diffusion layers 3a2. The P type impurity concentration of the P type diffusion layers 3a1 is higher than the P type impurity concentration of the P type diffusion layers 3a2. The P type impurity concentration of the P type diffusion layers 3a2 is higher than the P type impurity concentration of the P type diffusion layer 3b. The maximum value of the impurity concentration of the P type diffusion layers 3a2 is less than or equal to 1.0 E 17 cm$^{-3}$.

The P type diffusion layers 3a1 and the P type diffusion layers 3a2 are disposed alternately in one of in-plane directions as shown in FIG. 2, for example. The P type diffusion layers 3a1 and the P type diffusion layers 3a2 are disposed alternately in the one of in-plane directions with a constant cycle, for example. The P type diffusion layers 3a1 and the P type diffusion layers 3a2 may extend in a direction intersecting the one of in-plane directions. The P type diffusion layers 3a1 and the P type diffusion layers 3a2 may also be disposed alternatively in the direction intersecting the one of in-plane directions.

The same holds for the case where impurity concentration distribution of the P type diffusion layer 3 with respect to the thickness direction has more than two peaks. The impurity concentration at the peak closest to the first main surface 100a, the peak among the peaks of the impurity concentration distribution of the P type diffusion layer 3 with respect to the thickness direction, varies depending on in-plane position. The P type impurity concentration at the peak closest to the first main surface 100a, the peak among the peaks of the impurity concentration distribution of the P type diffusion layer 3 with respect to the thickness direction, are disposed alternately in the one of in-plane directions, for example. The P type impurity concentration at the peak closest to the first main surface 100a, the peak among the peaks of the impurity concentration distribution of the P type diffusion layer 3 with respect to the thickness direction, are disposed alternately in the one of in-plane directions with a constant cycle, for example.

The impurity concentration of the P type diffusion layer 3a varies depending on in-plane position, thus the resistance of the P type diffusion layer 3a and the anode electrode 4 is suppressed, and flow of holes from P type diffusion layer 3 into the N− type substrate 1 is suppressed. The recovery loss can be lowered by the suppression of the flow of holes into the N− type substrate 1.

As explained in <Comparative Example> above, if the impurity concentration of the P type diffusion layer 3z1 of the semiconductor device 10z1 or the impurity concentration of the P type diffusion layer 3z2 of the semiconductor device 10z2 varies depending on the in-plane position, full depletion of the P type diffusion layer 3z1 or the P type diffusion layer 3z2 may occur in the position where the impurity concentration is low, and the semiconductor devices may be broken down. In the present embodiment, the full depletion of the P type diffusion layer 3 during the recovery operation of high current and high voltage is suppressed and the breakdown of the semiconductor device by the full depletion is suppressed, because the P type impurity concentration distribution of the P type diffusion layer 3 with respect to the thickness direction has plurality of peaks, and the impurity concentration at the peak closest to the first main surface 100a varies depending on the in-plane direction.

The P type impurity concentration distribution of the P type diffusion layer 3 with respect to the thickness direction has plurality of peaks, thus the in-plane gradient of the impurity concentration in the P type diffusion layer 3a is mitigated in the portion of P type diffusion layer 3a on the N− type substrate 1 side, and the breakdown of the semiconductor device 10b by the dynamic avalanche is suppressed.

While the disclosure has been shown and described in detail, the foregoing description is in all aspects illustrative and not restrictive. It is therefore understood that numerous modifications and variations can be devised.

What is claimed is:

1. A semiconductor device comprising:
a semiconductor base body having a first main surface and a second main surface;
a first electrode; and
a second electrode,
wherein the semiconductor base body includes:
a first semiconductor layer of a first conductivity type provided on the second main surface side of the semiconductor base body;
a second semiconductor layer of the first conductivity type having a first conductivity type impurity concentration lower than that of the first semiconductor layer and provided closer to the first main surface than the first semiconductor layer is; and
a third semiconductor layer of a second conductivity type provided closer to the first main surface than the second semiconductor layer is,
wherein the first semiconductor layer is electrically connected to the second electrode in the second main surface,
wherein the third semiconductor layer is electrically connected to the first electrode in the first main surface,
wherein an impurity concentration distribution of the third semiconductor layer with respect to thickness direction of the semiconductor base body has a plurality of peaks,
wherein a thickness W of the third semiconductor layer, a thickness $W_{N-}$ of the second semiconductor layer, elementary charge q,
a relative permittivity $\varepsilon_s$ of a semiconductor material of the semiconductor base body,
vacuum permittivity $\varepsilon_0$,
a rated voltages $V_r$,
a rated current density $J_r$,
a carrier lifetime $\tau$ of a second conductivity type carrier in the second semiconductor layer,
a dose amount $D_A$ of the third semiconductor layer,
an average carrier concentration $n_{Avg}$,
an electric charge density $N'_D$, and $\alpha(\tau)$ which is given as Formula 2 below and which represents a relation between an average carrier concentration of the second semiconductor layer in on-state of the semiconductor device and an electric charge concentration in a depletion layer around a border of the second semiconductor layer and the third semiconductor layer among the second semiconductor layer in recovery process of the semiconductor device, wherein $\alpha(\tau)$ is a factor of proportionality represented by Formula 1 below,
satisfy Formula 3 below $$N'_D = \alpha(\tau) n_{Avg} \qquad \text{<Formula 1>}$$

$$\alpha(\tau) = \frac{4.15}{(\ln(2.58\tau + 1))^{4.77} + 225} \qquad \text{<Formula 2>}$$

$$W > \frac{1.6\varepsilon_s\varepsilon_0 V_r}{qD_A} - \frac{2qW_{N-}D_A}{2.5\alpha(\tau)J_r\tau}. \qquad \text{<Formula 3>}$$

2. The semiconductor device according to claim 1, wherein
the thickness W of the third semiconductor layer,
the thickness $W_{N-}$ of the second semiconductor layer,
the elementary charge q,
the relative permittivity $\varepsilon_s$ of the semiconductor material,
the vacuum permittivity $\varepsilon_0$,
the rated voltages $V_r$,
the rated current density $J_r$,
the carrier lifetime $\tau$ of the second conductivity type carrier in the second semiconductor layer,
the dose amount $D_A$ of the third semiconductor layer,
and the $\alpha(\tau)$
satisfy Formula 4 below $$W > \frac{1.8\varepsilon_s\varepsilon_0 V_r}{qD_A} - \frac{2qW_{N-}D_A}{2.5\alpha(\tau)J_r\tau}. \qquad \text{<Formula 4>}$$

3. The semiconductor device according to claim 1, wherein
the thickness W of the third semiconductor layer,
the thickness $W_{N-}$ of the second semiconductor layer,
the elementary charge q,
the relative permittivity $\varepsilon_s$ of the semiconductor material,
the vacuum permittivity $\varepsilon_0$,
the rated voltages $V_r$,
the rated current density $J_r$,
the carrier lifetime $\tau$ of the second conductivity type carrier in the second semiconductor layer,
the dose amount $D_A$ of the third semiconductor layer,
and the $\alpha(\tau)$
satisfy Formula 4 below $$W > \frac{1.6\varepsilon_0 V_r}{qD_A} - \frac{2qW_{N-}D_A}{3\alpha(\tau)J_r\tau}. \qquad \text{<Formula 4>}$$

4. The semiconductor device according to claim 1, wherein
the thickness W of the third semiconductor layer,
the thickness $W_{N-}$ of the second semiconductor layer,
the elementary charge q,
the relative permittivity $\varepsilon_s$ of the semiconductor material,
the vacuum permittivity $\varepsilon_0$,
the rated voltages $V_r$,
the rated current density $J_r$, the carrier lifetime τ of the second conductivity type carrier in the second semiconductor layer, the dose amount $D_A$ of the third semiconductor layer, and the α(τ)

satisfy Formula 4 below $$W > \frac{1.8\varepsilon_s\varepsilon_0 V_r}{qD_A} - \frac{2qW_{N-}D_A}{3\alpha(\tau)J_r\tau}. \qquad <\text{Formula 4}>$$

5. The semiconductor device according to claim 1, wherein a minimum value of a second conductivity type impurity concentration in a region of the third semiconductor layer between a peak closest to the first main surface of the plurality of peaks of the impurity concentration distribution and a peak closest to the second main surface of the plurality of peaks of the impurity concentration distribution is higher than a first conductivity type impurity concentration of the second semiconductor layer.

6. The semiconductor device according to claim 1, wherein a maximum value of the impurity concentration distribution of the third semiconductor layer is less than or equal to $1.0E17$ $cm^{-3}$.

7. The semiconductor device according to claim 1, wherein a maximum value of the impurity concentration distribution of the third semiconductor layer is less than or equal to $2.5E16$ $cm^{-3}$.

8. The semiconductor device according to claim 1, wherein a minimum value of a second conductivity type impurity concentration in a region of the third semiconductor layer between a peak closest to the first main surface of the plurality of peaks of the impurity concentration distribution and a peak closest to the second main surface of the plurality of peaks of the impurity concentration distribution is larger than or equal to $\frac{1}{10}$ times a maximum value of the impurity concentration distribution of the third semiconductor layer.

9. The semiconductor device according to claim 1, wherein an impurity concentration in the third semiconductor layer is highest at a peak closest to the second main surface of the plurality of peaks of the impurity concentration distribution of the third semiconductor layer.

10. The semiconductor device according to claim 1, wherein in the third semiconductor layer, an impurity concentration in a peak closest to the first main surface of the plurality of peaks of the impurity concentration distribution varies depending on in-plane position.

11. The semiconductor device according to claim 10, wherein in the third semiconductor layer, in the peak closest to the first main surface of the plurality of peaks of the impurity concentration distribution, regions with relatively high impurity concentration and regions with relatively low impurity concentration are disposed alternatively in one of in-plane directions.

12. A method of manufacturing a semiconductor device, comprising:

forming a semiconductor base body having a first main surface and a second main surface;

forming a first electrode; and forming a second electrode, wherein the semiconductor base body includes:

a first semiconductor layer of a first conductivity type provided on the second main surface side of the semiconductor base body;

a second semiconductor layer of the first conductivity type having a first conductivity type impurity concentration lower than that of the first semiconductor layer and provided closer to the first main surface than the first semiconductor layer is; and a third semiconductor layer of a second conductivity type provided closer to the first main surface than the second semiconductor layer is, wherein the first semiconductor layer is electrically connected to the second electrode in the second main surface, wherein the third semiconductor layer is electrically connected to the first electrode in the first main surface, wherein an impurity concentration distribution of the third semiconductor layer with respect to thickness direction of the semiconductor base body has a plurality of peaks, wherein a thickness W of the third semiconductor layer, a thickness $W_{N-}$ of the second semiconductor layer, elementary charge q, a relative permittivity $\varepsilon_s$ of a semiconductor material of the semiconductor base body, vacuum permittivity ε0, a rated voltages $V_r$, a rated current density $J_r$, a carrier lifetime τ of a second conductivity type carrier in the second semiconductor layer, a dose amount $D_A$ of the third semiconductor layer, an average carrier concentration $n_{Avg}$, an electric charge density $N'_D$, and α(τ) which is given as Formula 2 below and which is a factor of proportionality between an average carrier concentration of the second semiconductor layer in on-state of the semiconductor device and an electric charge concentration in a depletion layer around a border of the second semiconductor layer and the third semiconductor layer among the second semiconductor layer in recovery process of the semiconductor device, wherein α(τ) is a factor of proportionality represented by Formula 1 below, satisfy Formula 3 below $$N'_D = \alpha(\tau)n_{Avg} \qquad <\text{Formula 1}>$$

$$\alpha(\tau) = \frac{4.15}{(\ln(2.58\tau+1))^{4.77}+225} \qquad <\text{Formula 2}>$$

$$W > \frac{1.6\varepsilon_s\varepsilon_0 V_r}{qD_A} - \frac{2qW_{N-}D_A}{2.5\alpha(\tau)J_r\tau}. \qquad <\text{Formula 3}>$$

* * * * *